US010365559B2

(12) United States Patent
Arimoto et al.

(10) Patent No.: US 10,365,559 B2
(45) Date of Patent: Jul. 30, 2019

(54) PHOTOSENSITIVE RESIN COMPOSITION, METHOD FOR MANUFACTURING CURED RESIN FILM, AND SEMICONDUCTOR DEVICE

(71) Applicant: TORAY INDUSTRIES, INC., Tokyo (JP)

(72) Inventors: Yukari Arimoto, Otsu (JP); Yuki Masuda, Otsu (JP); Ryoji Okuda, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 0 days.

(21) Appl. No.: 15/551,078

(22) PCT Filed: Feb. 9, 2016

(86) PCT No.: PCT/JP2016/053765
§ 371 (c)(1),
(2) Date: Aug. 15, 2017

(87) PCT Pub. No.: WO2016/140024
PCT Pub. Date: Sep. 9, 2016

(65) Prior Publication Data
US 2018/0031970 A1 Feb. 1, 2018

(30) Foreign Application Priority Data
Mar. 4, 2015 (JP) .................. 2015-042030

(51) Int. Cl.
| | | |
|---|---|---|
| *G03F 7/038* | (2006.01) | |
| *G03F 7/023* | (2006.01) | |
| *G03F 7/40* | (2006.01) | |
| *C08G 73/10* | (2006.01) | |
| *C08G 73/22* | (2006.01) | |
| *G03F 7/004* | (2006.01) | |
| *G03F 7/075* | (2006.01) | |
| *C08F 8/00* | (2006.01) | |
| *C08G 8/12* | (2006.01) | |
| *G03F 7/022* | (2006.01) | |
| *G03F 7/039* | (2006.01) | |
| *G03F 7/16* | (2006.01) | |
| *G03F 7/20* | (2006.01) | |
| *G03F 7/32* | (2006.01) | |
| *H01L 23/00* | (2006.01) | |

(52) U.S. Cl.
CPC ............ *G03F 7/0387* (2013.01); *C08F 8/00* (2013.01); *C08G 8/12* (2013.01); *C08G 73/10* (2013.01); *C08G 73/106* (2013.01); *C08G 73/1039* (2013.01); *C08G 73/1042* (2013.01); *C08G 73/1053* (2013.01); *C08G 73/22* (2013.01); *G03F 7/004* (2013.01); *G03F 7/0046* (2013.01); *G03F 7/023* (2013.01); *G03F 7/0226* (2013.01); *G03F 7/0233* (2013.01); *G03F 7/0236* (2013.01); *G03F 7/038* (2013.01); *G03F 7/039* (2013.01); *G03F 7/075* (2013.01); *G03F 7/0755* (2013.01); *G03F 7/0757* (2013.01); *G03F 7/161* (2013.01); *G03F 7/162* (2013.01); *G03F 7/168* (2013.01); *G03F 7/2004* (2013.01); *G03F 7/322* (2013.01); *G03F 7/40* (2013.01); *H01L 24/02* (2013.01); *H01L 2224/024* (2013.01); *H01L 2224/02311* (2013.01); *H01L 2224/02379* (2013.01); *H01L 2924/07025* (2013.01)

(58) Field of Classification Search
CPC ................................. G03F 7/0387; G03F 7/40
USPC ............................................... 430/270.1, 906
See application file for complete search history.

(56) References Cited

U.S. PATENT DOCUMENTS

| | | | | |
|---|---|---|---|---|
| 7,750,102 B2 * | 7/2010 | Watanabe | ............. | H01L 21/312 |
| | | | | 526/172 |
| 8,187,788 B2 * | 5/2012 | Miyazaki | ........... | C08G 73/1046 |
| | | | | 264/405 |
| 8,932,799 B2 * | 1/2015 | Wu | ..................... | H01L 21/0274 |
| | | | | 430/270.1 |
| 2013/0214379 A1 | 8/2013 | Niwa | | |

FOREIGN PATENT DOCUMENTS

| | | |
|---|---|---|
| EP | 1909142 A1 | 4/2008 |
| JP | 2007-16214 A | 1/2007 |
| JP | 2007-39486 A | 2/2007 |
| JP | 2007 240554 A | 9/2007 |

(Continued)

OTHER PUBLICATIONS

International Search Report, issued in PCT/JP2016/053765, dated May 10, 2016.

(Continued)

*Primary Examiner* — John S Chu
(74) *Attorney, Agent, or Firm* — Birch, Stewart, Kolasch & Birch LLP

(57) ABSTRACT

Provided is a photosensitive resin composition containing: one or more kinds of alkali-soluble resins selected from a polyimide, a polybenzoxazole, a polyimide precursor, a polybenzoxazole precursor, and a copolymer formed of two or more polymers selected from the preceding substances; and a photosensitizer. The photosensitive resin composition further contains a compound represented by general formula (1). Even when a cured film is fired at low temperature, the photosensitive resin composition exhibits superior adhesion properties with metallic materials, particularly copper, and also exhibits high chemical resistance.

15 Claims, 2 Drawing Sheets

(56) References Cited

FOREIGN PATENT DOCUMENTS

| JP | 2008-58839 A | 3/2008 |
|---|---|---|
| JP | 2008-276190 A | 11/2008 |
| JP | 2010-128011 A | 6/2010 |
| JP | 2010-276631 A | 12/2010 |
| JP | 2012-27490 A | 2/2012 |
| JP | 2013-250429 A | 12/2013 |
| JP | 2014-174235 A | 9/2014 |
| JP | 2015-151405 A | 8/2015 |
| JP | 2016-45220 A | 4/2016 |
| WO | WO 2010/001780 A1 | 1/2010 |
| WO | WO 2012/002134 A1 | 1/2012 |
| WO | WO 2014/175316 A1 | 10/2014 |
| WO | WO 2014/199800 A1 | 12/2014 |

OTHER PUBLICATIONS

Written Opinion of the International Searching Authority, issued in PCT/JP2016/ 053765, dated May 10, 2016.
Extended European Search Report, dated Aug. 29, 2018, for European Application No. 16758719.5.

* cited by examiner

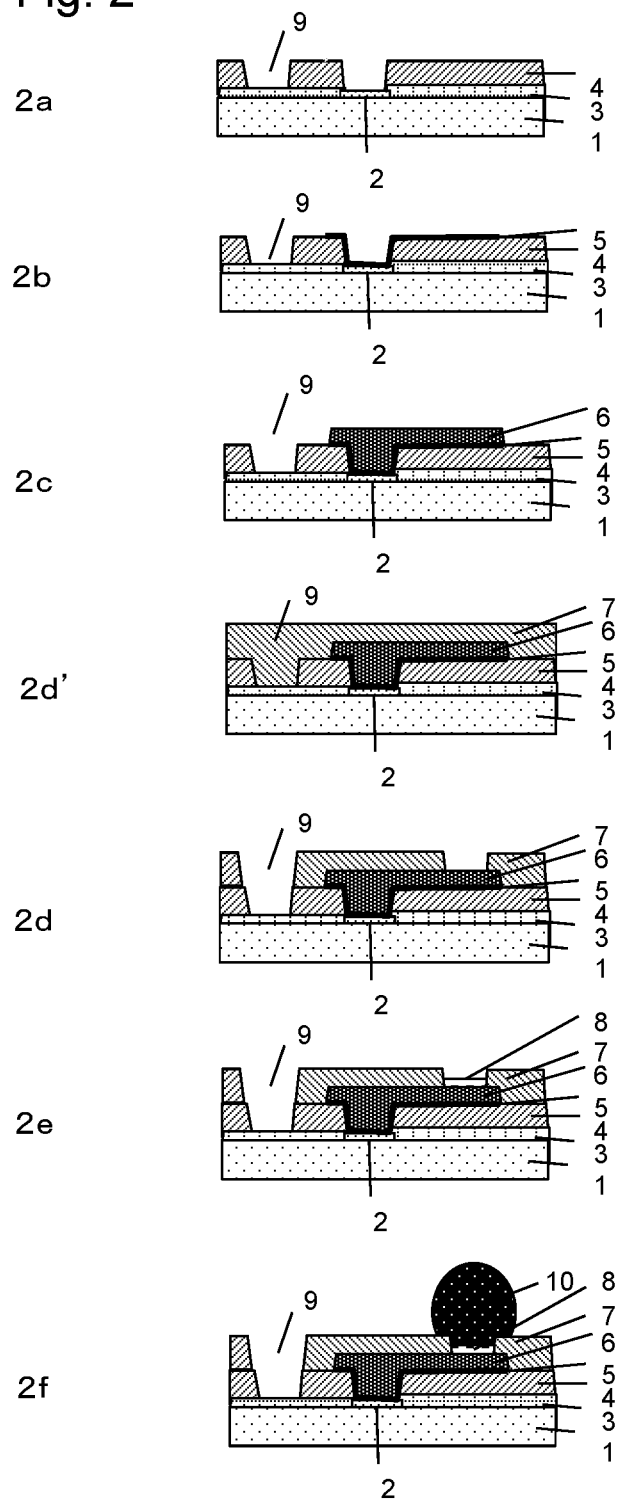

PHOTOSENSITIVE RESIN COMPOSITION, METHOD FOR MANUFACTURING CURED RESIN FILM, AND SEMICONDUCTOR DEVICE

TECHNICAL FIELD

The present invention relates to a photosensitive resin composition. More specifically, the present invention relates to a photosensitive resin composition, a method for producing a cured resin film using the same, and a semiconductor device using the same, in which the composition is preferably used for insulating films in contact with electrodes or wiring composed of a metal material, for example, surface protective films for semiconductor elements, interlayer dielectric films, insulating layers of organic electroluminescence elements, and the like.

BACKGROUND ART

Heretofore, polyimide resins, polybenzoxazole resins, and the like which have an excellent heat resistance, mechanical characteristics, and other characteristics have widely been used for surface protective films, interlayer dielectric films, and the like for semiconductor elements of electronic equipment. When polyimides and polybenzoxazoles are used for surface protective films or interlayer dielectric films, one of the methods for forming through-holes and the like is etching using a positive-working photoresist. However, this method is problematic in that the processes of applying and releasing a photoresist are needed, and complicated. In this regard, heat-resistant materials with photosensitivity imparted thereto have been reviewed in order to streamline working processes.

Usually, a coating film of a precursor of a polyimide or a polybenzoxazole is thermally cyclodehydrated to thereby afford a thin film having an excellent heat resistance and mechanical characteristics. In this case, high temperature baking at about 350° C. is usually needed. However, for example, MRAM (magnetoresistive random access memory), which is promising as next generation memory, is susceptible to high temperature. On that account, in order to be used for surface protective films of such elements, polyimide resins or polybenzoxazole resins which can be cured by baking at a low temperature of approximately 250° C. or less and achieve performance favorably comparable to that of conventional materials baked at a high temperature of approximately 350° C. are demanded.

Examples of methods for obtaining polyimide resins or polybenzoxazole resins which are cured by baking at low temperature include addition of a ring-closing promoter, a method in which to introduce into a unit structure an organic group for promoting ring-closing at low temperature, a method in which to use a polyimide or a polybenzoxazole which is preliminary ring-closed after having alkali solubility imparted thereto, and the like.

In another respect, when a heat-resistant resin composition is used for applications for semiconductors and the like, the heat-cured film remains as a permanent film in a device, which means that the properties of the film cured after being heated are very important. To secure reliability in semiconductor packages, the adhesion to a material formed on the surface of a semiconductor chip is important. In particular when a heat-resistant resin composition is used for applications such as an insulating film between wiring layers of a wafer level package, the adhesion to a metal material used for electrodes and wiring is important. There is a problem, however, in that a resin composition containing a resin that can be cured at low temperature has a low adhesion to metals used as these wiring materials. It is generally considered that, because of having a rigid main-chain structure, a heat-resistant resin has an adhesion strength that is not high to a metal material, and particularly in a cured resin film formed out of a resin composition with photosensitivity imparted thereto, the composition includes additives such as a photosensitizer, a sensitizer, an acid generator, and a solubility adjusting agent, which still remain in the cured film after heat-curing, resulting in the cured resin film having a lower adhesion strength than one which does not contain such additives.

Further, along with a demand for a higher degree of integration, smaller size, and higher speed, recent semiconductor packages have led to having a structure in which wiring and insulating films are formed in multiple layers even on such a cured resin film which has been formed, and cured resin films have been required to have chemical resistance to withstand such processes. Polyimides and polybenzoxazoles are originally resins that have a high chemical resistance, but when they have photosensitivity imparted thereto or when they are baked at low temperature, the cured resin film may have an insufficient chemical resistance because additive components remain therein. As a solution to these, the enhancement of chemical resistance due to a film density increased by adding a thermal acid generator or a polymer crosslinking agent has been considered (see Patent Literature 1 and 2). By carrying these out, however, the adhesion to a substrate tends to become even lower, and materials which can achieve both high chemical resistance and adhesion to wiring are demanded.

Specific examples of methods for improving the adhesion to metal materials include: positive-working photosensitive resin compositions composed of an alkali-aqueous-solution-soluble polymer, a photo-acid generator, and a silane compound containing 4 or more specific functional groups bound directly to an Al atom, a Ti atom, or a Si atom (see Patent Literature 3); and heat-resistant resin precursor compositions composed of a heat resistance resin precursor such as a polyimide precursor and of a specific amino compound or a thiol derivative (see Patent Literature 4).

CITATION LIST

Patent Literature

Patent Literature 1: JP 2007-16214 A
Patent Literature 2: JP 2007-240554 A
Patent Literature 3: JP 2008-276190 A
Patent Literature 4: JP 2007-39486 A

SUMMARY OF INVENTION

Technical Problem

However, these resin compositions require high temperature baking at approximately 350° C. for the ring-closing of the heat-resistant resin, and there is a problem in that when baked at a low temperature of 250° C. or less, the resin is insufficiently ring-closed, whereby the film is insufficiently cured and fails to achieve sufficient adhesion to a metal material.

An object of the present invention is to provide a photosensitive resin composition which can afford, a cured film having an excellent adhesion to a metal material, copper among others, and a high chemical resistance even through low temperature baking at 250° C. or less.

Solution to Problem

To solve the aforementioned problem, the photosensitive resin composition according to the present invention has the following constitution: in other words, a photosensitive resin composition including: one or more kinds of alkali-soluble resins selected from a polyimide, a polybenzoxazole, a polyimide precursor, a polybenzoxazole precursor, and a copolymer of two or more kinds of polymers selected therefrom; and a photosensitizer; wherein the photosensitive resin composition further includes a compound represented by the following general formula (1);

[Chem. 1]

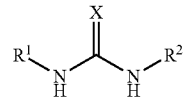
(1)

wherein, in the general formula (1), $R^1$ and $R^2$ each independently represent a $C_1$-$C_{20}$ monovalent organic group; and X represents an oxygen atom or a sulfur atom. In addition, the present invention includes a method for producing a cured resin film, comprising the steps of: coating a substrate with the photosensitive resin composition and drying the composition to obtain a resin film; exposing the resin film obtained from the previous step; developing the exposed resin film using an alkali aqueous solution to form a pattern out of the resin film; and heating the developed resin film. In addition, the present invention includes a method for producing a photosensitive uncured sheet, comprising the steps of: coating a substrate with the photosensitive resin composition and drying the composition to obtain a resin film; and releasing the resin film obtained from the previous step.

In addition, the present invention includes a semiconductor device including a element, wherein a cured film of the photosensitive resin composition is formed as an interlayer dielectric film on the semiconductor element, wherein wiring is formed on the cured film.

In addition, the present invention includes a semiconductor device including a substrate constituted of two or more kinds of materials, wherein a cured film of the photosensitive resin composition is formed as an interlayer dielectric film on the substrate, wherein wiring is formed on the cured film.

Advantageous Effects of Invention

The photosensitive resin composition according to the present invention can afford a cured film having an excellent adhesion to a metal material, copper among others, and a high chemical resistance even during low temperature baking.

BRIEF DESCRIPTION OF DRAWINGS

FIG. 2 is a detailed view depicting a method for producing a semiconductor device having a bump.

DESCRIPTION OF EMBODIMENTS

Figure 1:
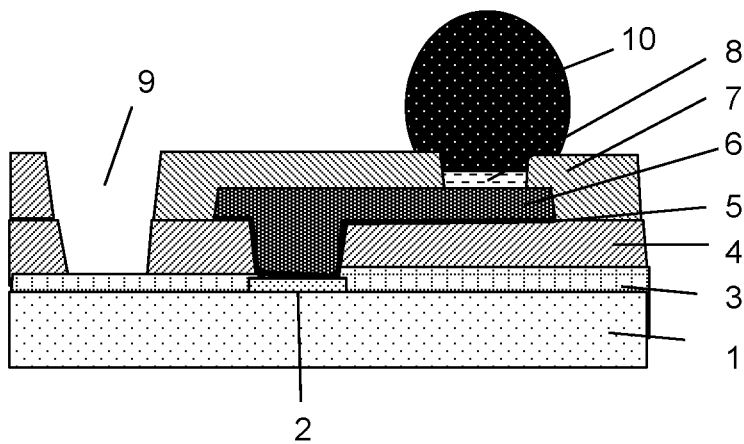
FIG. 1 is a view depicting an enlarged cross-section of a pad portion of a semiconductor device having a bump.

The photosensitive resin composition according to the present invention includes: one or more kinds of alkali-soluble resins selected from a polyimide, a polybenzoxazole, a polyimide precursor, a polybenzoxazole precursor, and copolymer of two or more kinds of polymers selected therefrom; and photosensitizer; wherein the photosensitive resin composition further includes a compound represented by the following general formula (1):

[Chem. 2]

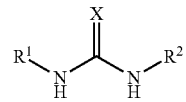
(1)

wherein, in the general formula (1), $R^1$ and $R^2$ each independently represent a $C_1$-$C_{20}$ monovalent organic group; and X represents an oxygen atom or a sulfur atom. Below, each component will be described.

The heat-resistant resin composition according to the present invention includes one or more kinds of alkali soluble resins selected from a polyimide, a polybenzoxazole, a polyimide precursor, a polybenzoxazole precursor, and a copolymer of two or more kinds of polymers selected therefrom. As used herein, "alkali-soluble" refers to the ability to dissolve in an aqueous solution of an alkali such as tetramethylammonium hydroxide, choline, triethylamine, dimethylaminopyridine, monoethanolamine, diethylamino ethanol, sodium hydroxide potassium hydroxide, sodium carbonate, or the like. Specifically, the composition is preferably dissolved in a 2.38 wt % tetramethylammonium hydroxide aqueous solution. The solution may contain two or more kinds of these. A polyimide and a polybenzoxazole are resins having a cyclic structure of an imide ring or an oxazole ring in the main-chain structure. In addition, the precursors thereof, i.e., a polyimide precursor and a polybenzoxazole precursor, are resins which have an imide ring structure and a benzoxazole ring structure respectively formed through being cyclodehydrated. The number of repeats of the structural unit in these polymers is preferably 10 to 100,000. This range is preferable because the resin materials have sufficient heat, resistance and mechanical characteristics and pose no problem with the photosensitive ability.

Because these resins have an excellent heat resistance and moisture resistance, their adhesion to metal is less likely to result in a decrease due to change of properties of the cured resin film, even under high temperature and high humidity.

Polyimides can be obtained by reacting a tetracarboxylic acid, the corresponding tetracarboxylic dianhydride, tetracarboxylic diester dichloride, or the like with a diamine, the corresponding diisocyanate compound, trimethylsilylated diamine or the like and have a tetracarboxylic residue and a diamine residue. For example, a polyamic acid, which is one of the polyimide precursors obtained by reacting a tetracarboxylic dianhydride with a diamine, can be cyclodehydrated through heat treatment to thus afford a polyimide. During this heat treatment, a solvent azeotropic with water, such as m-xylene, can be added. Alternatively, the cyclodehydration can be carried out by chemical heat treatment through the addition of a dehydrating/condensing agent such as carboxylic anhydride or dicyclohexylcarbodiimide and a ring-closing catalyst such as a base of triethylamine or the like. Alternatively, the cyclodehydration can be carried out by adding a weak acid carboxylic compound and performing heat treatment at a low temperature of 100° C. or less.

Polybenzoxazoles can be obtained by reacting a bisaminophenol compound with a dicarboxylic acid, the corresponding dicarboxylic chloride, dicarboxylic active ester, or the like, and have a dicarboxylic residue and a bisaminophenol residue. For example a polyhydroxy amide, which is one of the polybenzoxazole precursors obtained by reacting a bisaminophenol compound with a dicarboxylic acid, is cyclodehydrated through heat treatment and thus can afford a polybenzoxazole. Alternatively, the cyclodehydration can be carried out by chemical treatment through the addition of a phosphoric anhydride, a base, a carbodiimide compound, or the like.

The photosensitive resin composition according to the present invention contains a photosensitizer. Examples of photosensitizers include photo-acid generators and combinations of a photopolymerization initiator and a compound having two or more ethylenic unsaturated bonds. The photosensitive resin composition containing a photo-acid generator results in generating acid in the light-irradiated parts and increasing the solubility of the light-irradiated parts into an alkali aqueous solution, and can afford a positive-working relief pattern where the light-irradiated parts are dissolved. In addition, the photosensitive resin composition containing a photo-acid generator and an epoxy compound or a thermal crosslinking agent causes the acid generated in the light-irradiated parts to facilitate the crosslinking reaction of the epoxy compound or the thermal crosslinking agent, and can afford a negative relief pattern where the light-irradiated parts are insolubilized. In addition, the photosensitive resin composition containing a photopolymerization initiator and a compound having two or more ethylenic unsaturated bonds causes active radicals generated in the light-irradiated parts to advance the radical polymerization of the ethylenic unsaturated bonds, and can afford a negative relief pattern where the light-irradiated parts are insolubilized.

Examples of photo-acid generators include a quinone diazide compound, a sulfonium salt, a phosphonium salt, a diazonium salt, and an iodonium salt.

Examples of quinone diazide compounds include: a compound produced by binding quinone diazide sulfonic acid to a polyhydroxyl compound via an ester bond; a compound produced by binding quinone diazide sulfonic acid to a polyamino compound via a sulfoneamide bond; and a compound produced by binding quinone diazide sulfonic acid to a polyhydroxyl polyamino compound via an ester bond and/or a sulfoneamide bond. It is preferable that 50 mol % or more of all of functional groups in these polyhydroxyl compounds or polyamino compounds be substituted by quinone diazide. The 50 mol % or more substitution by quinone diazide has the advantage that the solubility of the resin film into an alkali developing solution in the light-exposed parts is enhanced and a fine pattern in which their contrast with the unexposed parts is high can be obtained. In addition, two or more kinds of photo-acid generators are preferably contained, whereby a heat resistant resin composition with high sensitivity photosensitive characteristics imparted thereto can be obtained.

As a quinone diazide compound, either of one having a 5-naphthoquinone diazide sulfonyl group and one having a 4-naphthoquinone diazide sulfonyl group can preferably be used. A 4-naphthoquinone diazide sulfonyl ester compound has an absorption in an i-line range of a mercury lamp, and is therefore suitable for the exposure to i-line. A 5-naphthoquinone diazide sulfonyl ester compound has an absorption up to a g-line range of a mercury lamp, and is therefore suitable for the exposure to g-line. It is preferable to select a 4-naphthoquinone diazide sulfonyl ester compound or a 5-naphthoquinone diazide sulfonyl ester compound depending on the wavelength to be exposed. It is also possible to contain a naphthoquinone diazide sulfonyl ester compound having both a 4-naphthoquinone diazide sulfonyl group and a 5-naphthoquinone diazide sulfonyl group in the same molecule thereof, or it is also possible to contain both a 4-naphthoquinone diazide sulfonyl ester compound and a 5-naphthoquinone diazide sulfonyl ester compound.

Among these photo-acid generators, a sulfonium salt, a phosphonium salt and a diazonium salt are preferred, because an acid component generated upon the exposure to light can be stabilized to a suitable degree. In particular, a sulfonium salt is preferred. In addition, a sensitizer or the like may be contained, if necessary.

Examples of photopolymerization initiators include: diethoxyacetophenon, 2-hydroxy-2-methyl-1-phenylpropane-1-one, benzyldimethylketal, 1-(4-isopropylphenyl)-2-hydroxy-2-methylpropane-1-one, 4-(2-hydroxyethoxy)phenyl-(2-hydroxy-2-propyl)ketone, 1-hydroxycyclohexyl-phenylketone, 1-phenyl-1,2-propanedione-2-(o-ethoxycarbonyl)oxime, 2-methyl-[4-(methylthio)phenyl]-2-morpholinopropane-1-one, 2-benzyl-2-dimethylamino-1-(4-morpholinophenyl)-butanone-1, benzoin, benzoin methyl ether, benzoin ethyl ether, benzoin isopropyl ether, benzoin isobutyl ether, benzophenone, methyl o-benzoylbenzoate, 4-phenylbenzophenone 4,4-dichlorobenzophenone, hydroxybenzophenone, 4-benzoyl-4'-methyl-diphenyl sulfide, alkylated benzophenone, 3,3',4,4'-tetra (t-butylperoxycarbonyl)benzophenone, 4-benzoyl-N,N-dimethyl-N-[2-(1-oxo-2-propenyloxy)ethyl]benzenemethanaminium bromide, (4-benzoylbenzyl)trimethylammonium chloride, 2-hydroxy-3-(4-benzoylphenoxy)-N,N,N-trimethyl-1-propanaminium chloride monohydrate, 2-isopropylthioxanthone, 2,4-dimethylthioxanthone, 2,4-diethylthioxanthone, 2,4-dichlorothioxanthone, 2-hydroxy-3-(3,4-dimethyl-9-oxo-9H-thioxanthene-2-yloxy)-N,N,N-trimethyl-1-propanaminium chloride, 2,4,6-trimethylbenzoylphenylphosphine oxide, 1,2-octanedion-1-[4-(phenylthio)-2-(o-benzoyloxime)], ethanone, 1-[9-ethyl-6-(2-methylbenzoyl)-9H-carbazole-3-yl]-,1-o-acetyloxime), 2,2'-bis(o-chlorophenyl)-4,5,4',5'-tetraphenyl-1,2-biimidazole, 10-butyl-2-chloroacridone, 2-ethylanthraquinone, benzyl, 9,10-phenanthrenequinone, camphor quinone, methylphenylglyoxy ester, $\eta^5$-cyclopentadienyl-$\eta^6$-cumenyl-iron (1+)-hexafluorophosphate (1−), diphenylsulfide derivative, bis($\eta^5$-2,4-cyclopentadiene-1-yl)-bis(2,6-difluoro-3-(1H-pyrrole-1-yl)-phenyl)titanium, 4,4-bis(dimethylamino)benzophenone, 4,4-bis(diethylamino)benzophenone, thioxanthene, 2-methylthioxanthone, 2-chlorothioxanthone, 4-benzoyl-4-methylphenyl ketone, dibenzyl ketone, fluorenone, 2,3-diethoxyacetophenon, 2,2-dimethoxy-2-phenyl-2-phenylacetophenon, 2-hydroxy-2-methylpropiophenon, p-t-butyldichloroacetophenon, benzylmethoxyethylacetal, anthraquinone, 2-t-butylanthraquinone, 2-aminoanthraquinone, β-chloranthraquinone, anthrone, benzanthrone, dibenzosuberone, methyleneanthrone, 4-azidobenzalacetophenon, 2,6-bis(p-azidobenzylidene)cyclohexane, 2,6-bis(p-azidobenzylidene)-4-methylcyclohexanone, 2-phenyl-1,2-butadione-2-(o-methoxycarbonyl)oxime, 1,3-diphenylpropanetrione-2-(o-ethoxycarbonyl)oxime, naphthalenesulfonyl chloride, quinolinesulfonyl chloride, N-phenylthioacridone, 4,4-azobisisobutyronitrile, benzthiazole disulfide, triphenylphosphine, tetrabrominated carbon, tribromophenylsulfone, benzoyl peroxide, and the like; and combinations of a photoreducing dye such as eosin or methylene blue and a reducing agent such as ascorbic acid and triethanol amine. The photopolymerization initiator may contain two or more kinds of these.

Examples of compounds having two or more ethylenic unsaturated bonds include, but are not limited to, acryl monomers such as ethylene glycol dimethacrylate, ethylene glycol diacrylate, diethylene glycol dimethacrylate, trimethylolpropane triacrylate, ethoxylated bisphenol A dimethacrylate, glycerin dimethacrylate, tripropylene glycol dimethacrylate, butanediol dimethacrylate, glycerin triacrylate, pentaerythritol triacrylate, pentaerythritol tetraacrylate, dipentaerythritol hexaacrylate, ethoxylated pentaerythritol tetraacrylate, and ethoxylated isocyanuric triacrylate. The composition may also contain two or more kinds of these.

The content of the photosensitizer is preferably 0.05 to 50 parts by weight relative to 100 parts by weight of the alkali-soluble resin. When the photosensitizer is a photo-acid generator, the content thereof is preferably 0.01 to 50 parts by weight relative to 100 parts by weight of the alkali-soluble resin from the viewpoint of increasing sensitivity. The content of a quinone diazide compound, among photo-acid generators, is preferably 3 to 40 parts by weight. In addition, the total content of the sulfonium salt, the phosphonium salt, and the diazonium salt is preferably 0.5 to 20 parts by weight relative to 100 parts by weight of the alkali-soluble resin. The contents in this range are preferable because of generating sufficient acid through light irradiation and enhancing sensitivity. In addition, the photo-acid generator content of 20 parts by weight or less is preferable because it will not generate a residual of the developed pattern.

The content of the photopolymerization initiator is preferably 0.1 to 20 parts by weight relative to 100 parts by weight of the alkali-soluble resin. The content of 0.1 parts by weight or more causes sufficient radicals to be generated by light irradiation, and enhances sensitivity. In addition, the content of 20 parts by weight or less does not make it possible that the parts that are not irradiated with light are cured by excessively generated radicals, and enhances the alkali developing property. The content of the compound having two or more ethylenic unsaturated bonds is preferably 5 to 50 parts by weight relative to 100 parts by weight of the alkali-soluble resin. The content of 5 parts by weight or more is preferable because of allowing a cured resin film having high mechanical characteristics to be obtained through crosslinking. The content of 50 parts by weight or less is preferable because it does not impair sensitivity.

In addition, for the purposes of solubility adjustment and the like, 1 to 50 parts by weight of a compound having one ethylenic unsaturated bond may be contained relative to 100 parts by weight of the alkali-soluble resin. The content of 1 part by weight or more is preferable because of adjusting the resin film to a suitable solubility and affording a developed film having a high residual film ratio. The content of 50 parts by weight or less is preferable because it does not impair sensitivity. Examples of such compounds include acrylic acid, methacrylic acid, methyl acrylate, methyl methacrylate, butyl acrylate, hydroxyethyl acrylate, hydroxyethyl methacrylate, dimethyl acrylamide, dimethylamino ethyl methacrylate, acryloylmorpholine, 1-hydroxyethyl α-chloroacrylate, 2-hydroxyethyl methacrylate, 2-hydroxyethyl, acrylate, 2-hydroxyethyl α-chloroacrylate, 1-hydroxypropyl methacrylate, 1-hydroxypropyl acrylate, 1-hydroxypropyl α-chloroacrylate, 2-hydroxypropyl methacrylate, 2-hydroxypropyl acrylate, 2-hydroxypropyl α-chloroacrylate, 3-hydroxypropyl methacrylate, 3-hydroxypropyl acrylate, 3-hydroxypropyl α-chloroacrylate 1-hydroxy-1-methylethyl methacrylate, 1-hydroxy-1-methylethyl acrylate, 1-hydroxy-1-methylethyl α-chloroacrylate, 2-hydroxy-1-methylethyl methacrylate, 2-hydroxy-1-methylethyl acrylate, 2-hydroxy-1-methylethyl α-chloroacrylate, 1-hydroxybutyl methacrylate, 1-hydroxybutyl acrylate, 1-hydroxybutyl α-chloroacrylate, 2-hydroxybutyl methacrylate, 2-hydroxybutyl acrylate, 2-hydroxybutyl α-chloroacrylate, 3-hydroxybutyl methacrylate, 3-hydroxybutyl acrylate, 3-hydroxybutyl α-chloroacrylate, 4-hydroxybutyl methacrylate, 4-hydroxybutyl acrylate, 4-hydroxybutyl α-chloroacrylate, 1-hydroxy-1-methylpropyl methacrylate, 1-hydroxy-1-methylpropyl acrylate, 1-hydroxy-1-methylpropyl α-chloroacrylate, 2-hydroxy-1-methylpropyl methacrylate, 2-hydroxy-1-methylpropyl acrylate, 2-hydroxy-1-methylpropyl α-chloroacrylate, 1-hydroxy-2-methylpropyl methacrylate 1-hydroxy-2-methylpropyl acrylate, 1-hydroxy-2-methylpropyl α-chloroacrylate, 2-hydroxy-2-methylpropyl methacrylate, 2-hydroxy-2-methylpropyl acrylate, 2-hydroxy-2-methylpropyl α-chloroacrylate 2-hydroxy-1,1-dimethylethyl methacrylate, 2-hydroxy-1,1-dimethylethyl acrylate, 2-hydroxy-1,1-dimethylethyl α-chloroacrylate, 1,2-dihydroxypropyl methacrylate, 1,2-dihydroxypropyl acrylate, 1,2-dihydroxypropyl α-chloroacrylate, 2,3-dihydroxypropyl methacrylate, 2,3-dihydroxypropyl acrylate, 2,3-dihydroxypropyl α-chloroacrylate, 2,3-dihydroxybutyl methacrylate, 2,3-dihydroxybutyl acrylate, 2,3-dihydroxybutyl α-chloroacrylate, p-hydroxystyrene, p-isopropenylphenol, phenethyl methacrylate, phenethyl acrylate, phenethyl α-chloroacrylate, N-methylol acrylamide, N-methylol methacryl amide, α-chloroacrylic acid, crotonic acid, 4-pentenoic acid, 5-hexenoic acid, 6-heptenoic acid, 7 octenoic acid, 8-nonanoic acid, 9-decanoic acid, 10-undecylenic acid, brassidic acid, ricinoleic acid, 2-(methacryloyloxy)ethyl isocyanate, 2-(acryloyloxy)ethyl isocyanate, 2-(α-chloroacryloyloxy)ethyl isocyanate, and the like.

The photosensitive resin composition according to the present invention contains, as an essential component, a urea compound represented by the aforementioned general formula (1). Here, the urea compound refers to a urea compound or a thiourea compound. By containing: one or more alkali-soluble resins selected from a polyimide, a polybenzoxazole, a polyimide precursor, a polybenzoxazole precursor, and a copolymer of two or more kinds of polymers selected therefrom; and a urea compound represented by the general formula (1), the photosensitive resin composition can remarkably enhance the adhesion of the baked cured film to a metal material, copper among others. This is because the nitrogen part of the compound represented by the general formula (1) interacts with a metal surface and because the urea structure has a stereo structure that interacts more readily with a metal surface. These effects can impart photosensitivity to the resin composition, and afford a cured resin film having an excellent adhesion to a metal material even when the composition contains additives.

In the general formula (1), $R^1$ and $R^2$ represent a $C_1$-$C_{20}$ monovalent organic group. $R^1$ and $R^2$ may be the same or different. X represents an oxygen atom or a sulfur atom.

Preferably, none of $R^1$ and $R^2$ is hydrogen, because of which the basicity of the nitrogen of the urea compound is high and no problem of the photosensitizer being deactivated occurs. In addition, preferably, none of $R^1$ and $R^2$ is hydrogen, because the adhesion under high humidity is not lowered.

Examples of $R^1$ and $R^2$ include alkyl groups, cycloalkyl groups, alkoxy groups, alkyl ether groups, alkylsilyl groups, alkoxysilyl groups, aryl groups, aryl ether groups, carboxyl group, carbonyl group, allyl group, vinyl group, heterocyclic groups, combinations thereof, and the like. These groups may further contain a substituent. Preferable examples of alkyl groups include methyl group, ethyl group, propyl group, butyl group pentyl group, and hexyl group from the viewpoint of adhesion to metal and stability Preferable examples of cycloalkyl groups include cyclopropyl group, cyclobutyl group, cyclopentyl group, and cyclohexyl group. Preferable examples of alkoxy groups include methoxy group, ethoxy group, propoxy group, butoxy group, and pentoxy group. Preferable examples of alkoxysilyl groups include methoxysilyl group, ethoxysilyl group, propoxysilyl group, and butoxysilyl group from the viewpoint of stability and adhesion. Preferable examples of aryl groups include phenyl group, tolyl group, xylyl group, and naphthyl group. Preferable examples of heterocyclic groups include triazole group, pyrrole group, furan group, thiophene group, imidazole group, oxazole group, thiazole group, pyrazole group, isooxazole group, isothiazole group, tetrazole group, pyridine group, pyridazine group, pyrimididine group, pyrazine group, piperidine group, piperidine group, piperazine group, morpholine group, 2H-pyran group, and 6H-pyran group, triazine group, and the like.

It is more preferable that, in the compound represented by the general formula (1), at least one of $R^1$ and $R^2$ be an organic group having an alkoxysilyl group. This can further enhance the adhesion to a substrate, and enables the composition to be preferably used for substrates constituted of a plurality of materials and having a more complicated surface. In particular, a substrate which is a substrate of silicon, nitride silicon, oxide silicon, or sealing resin and which is a substrate with metal wiring formed thereon is particularly preferable, because the urea sites can enhance the adhesion to metal, and because the alkoxysilyl groups can enhance the adhesion to the silicon, nitride silicon, oxide silicon, or sealing resin. It is more preferable that one of $R^1$ and $R^2$ be an organic group having an alkoxysilyl group, and that the other be an alkyl group having a smaller steric hindrance. In this regard, as alkyl groups whose steric hindrance is small, methyl group, ethyl group, propyl group, or butyl group is preferable, and methyl group is most preferable.

As alkoxysilyl groups, methoxysilyl group, ethoxysilyl group, propoxysilyl group, or butoxysilyl group is preferable, and methoxysilyl group whose steric hindrance is small is more preferable, from the viewpoint of stability and adhesion. Specific examples of organic groups having an alkoxysilyl group include trimethoxysilylpropyl group, triethoxysilylpropyl group, and the like.

The compound represented by the general formula (1) is preferably a thiourea compound in particular. In other words, X in the general formula (1) is preferably a sulfur atom. In general, a photosensitive resin composition to which a compound containing nitrogen is added may have sensitivity impaired through the interaction between a photosensitizer and a urea compound, but when the compound containing nitrogen is a thiourea compound, the basicity is suitably maintained, and the effect of enhancing adhesion can be obtained without lowering the sensitivity.

Examples of thiourea compounds having an alkoxysilyl group include, but are not limited to, the following structures:

[Chem. 3]

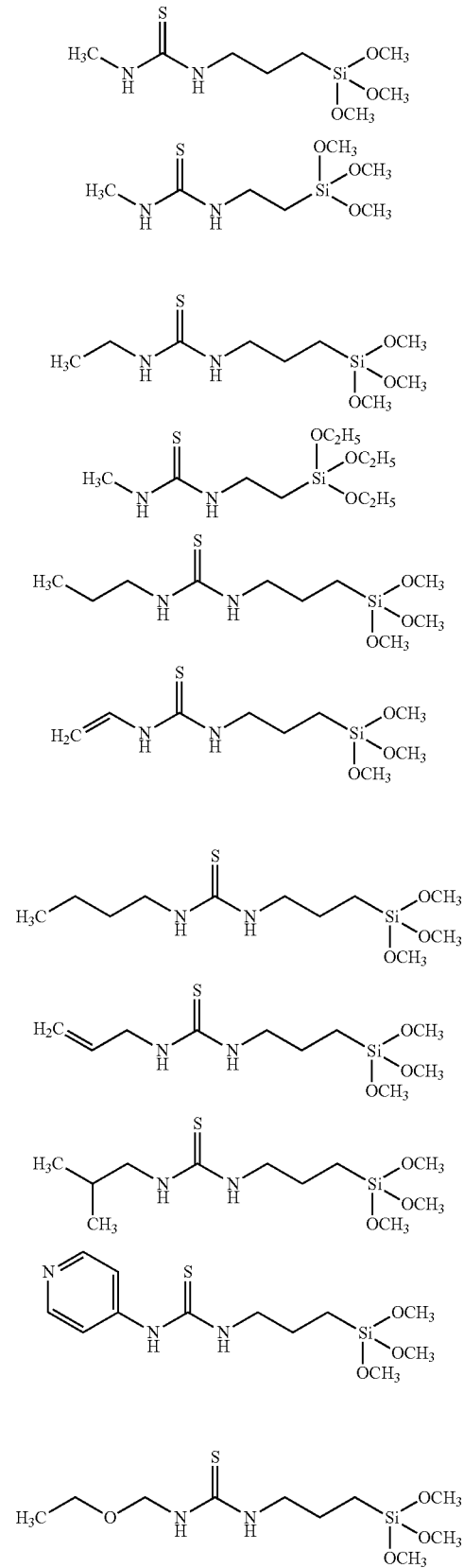

-continued

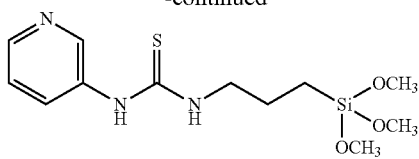
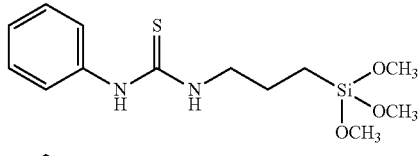
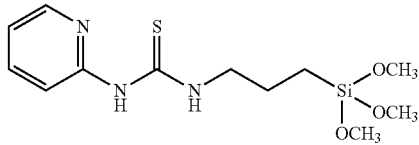
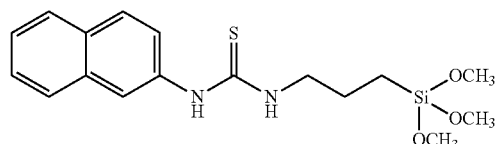
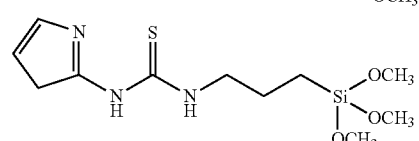
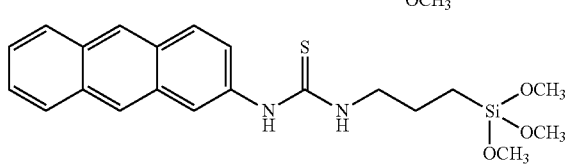
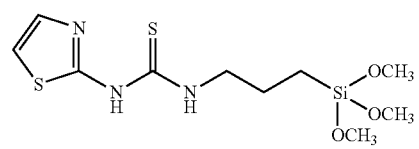
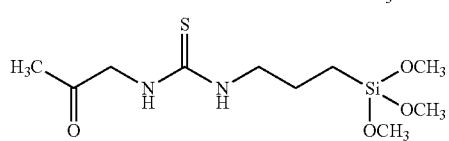
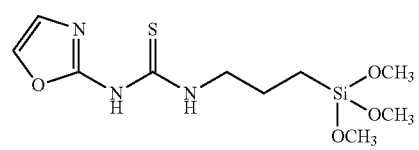
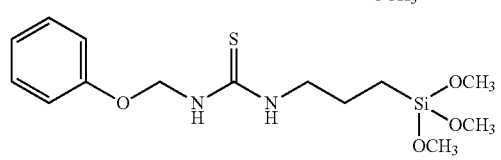
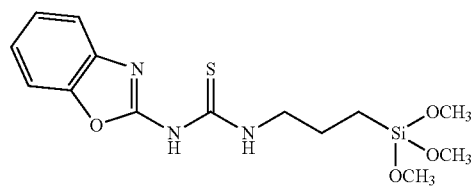

[Chem. 4]

-continued

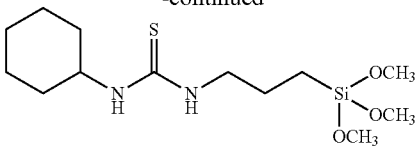
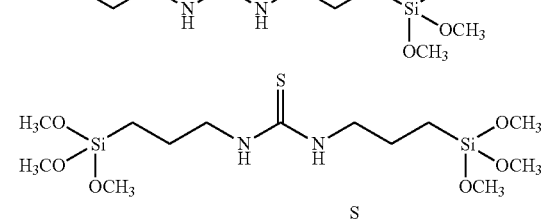
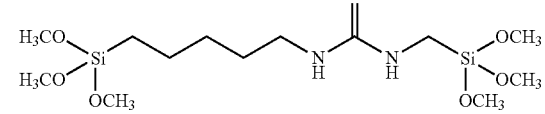

The addition amount of the compound represented by the general formula (1) is preferably 0.01 to 5.0 parts by weight, more preferably 0.1 to 5.0 parts by weight, relative to 100 parts by weight of the alkali-soluble resin. When the addition amount is less than 0.1 parts by weight, it is difficult to obtain the effect of enhancing adhesion to a metal material. In addition, when the addition amount is more than 5.0 parts by weight, the basicity may affect the photosensitizer and lower the sensitivity of the resin composition. The addition amount of the compound represented by the general formula (1) is more preferably 0.2 parts by weight or more. In addition, the addition amount is more preferably 3.0 parts by weight or less.

An alkali-soluble resin contained in the photosensitive resin composition is preferably one including a structure represented by the following general formula (2) or (3):

[Chem. 5]

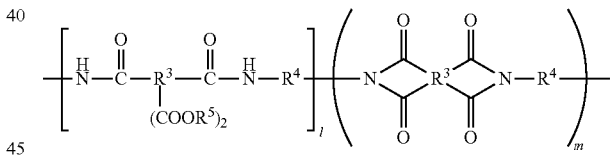

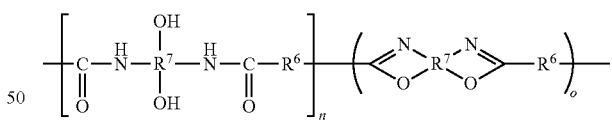

wherein, in the general formulae (2) and (3), $R^3$ and $R^7$ each independently represent a $C_6$-$C_{40}$ tetravalent organic group; $R^4$ and $R^6$ each independently represent a $C_2$-$C_{40}$ bivalent organic group; $R^5$ represents hydrogen or a $C_1$-$C_{20}$ monovalent organic group; l, m, n, and o each independently represent an integer of 0 to 10,000; l+m>1; and n+o>1.

In the general formula (2), $R^3$ represents a $C_6$-$C_{40}$ tetravalent organic group, and $R^4$ represents a $C_2$-$C_{40}$ bivalent organic group. $R^3$ and $R^4$ each preferably have an aromatic ring and/or aliphatic ring. When the structure contains a plurality of $R^3$s and $R^4$s, $R^3$ and $R^4$ may each be composed of only a single structure or include a plurality of structures.

In the general formula (2), $R^3$ represents a tetracarboxylic residue derived from a tetracarboxylic acid which serves as a raw material for an alkali-soluble resin. Examples of tetracarboxylic acids constituting $R^3$ may include aromatic tetracarboxylic acids such as pyromellitic acid, 3,3',4,4'-biphenyltetracarboxylic acid, 2,3,3',4'-biphenyltetracarboxylic acid, 2,2',3,3'-biphenyltetracarboxylic acid, 3,3',4,4'-benzophenonetetracarboxylic acid, 2,2',3,3'-benzophenonetetracarboxylic acid, 2,2-bis(3,4-dicarboxyphenyl)hexafluoropropane, 2,2-bis(2,3-dicarboxyphenyl)hexafluoropropane, 1,1-bis(3,4-dicarboxyphenyl)ethane, 1,1-bis(2,3-dicarboxyphenyl)ethane, bis(3,4-dicarboxyphenyl)methane, bis(2,3-dicarboxyphenyl)methane, bis(3,4-dicarboxyphenyl)sulfone, bis(3,4-dicarboxyphenyl)ether)ether, 1,2,5,6-naphthalenetetracarboxylic acid, 2,3,6,7-naphthalenetetracarboxylic acid, 2,3,5,6-pyridinetetracarboxylic acid, and 3,4,9,10-perylenetetracarboxylic acid, and aliphatic tetracarboxylic acids such as butanetetracarboxylic acid and 1,2,3,4-cyclopentanetetracarboxylic acid. These tetracarboxylic acids can be used directly or as derivatives such as acid anhydrides, active esters, and the like. In addition, two or more kinds of these tetracarboxylic acids may be used in combination.

In the general formula (2), $R^4$ represents a diamine residue derived from a diamine which serves as a raw material for an alkali-soluble resin. Examples of diamines constituting $R^4$ may include hydroxyl group-containing diamines such as 2,2-bis(3-amino-4-hydroxyphenyl)hexafluoropropane, bis (3-amino-4-hydroxyphenyl)sulfone, 2,2-bis(3-amino-4-hydroxyphenyl)propane, bis(3-amino-4-hydroxyphenyl)methane, bis(3-amino-4-hydroxyphenyl)ether, 3,3'-diamino-4,4'-biphenol, and 9,9-bis(3-amino-4-hydroxyphenyl)fluorene; sulfonic group-containing diamines such as 3-sulfonic acid-4,4'-diaminodiphenyl ether; thiol group-containing diamines such as dimercaptophenylenediamine; aromatic diamines such as 3,4'-diaminodiphenyl ether, 4,4'-diaminodiphenyl ether, 3,4''-diaminodiphenylmethane, 4,4'-diaminodiphenylmethane, 3,4'-diaminodiphenyl sulfone, 4,4'-diaminodiphenyl sulfone, 3,4'-diaminodiphenylsulfide, 4,4'-diaminodiphenylsulfide, 1,4-bis(4-aminophenoxy)benzene, benzidine, m-phenylenediamine, p-phenylenediamine, 1,5-naphthalenediamine, 2,6-naphthalenediamine, bis(4-aminophenoxyphenyl)sulfone, bis(3-aminophenoxyphenyl)sulfone, bis(4-aminophenoxy)biphenyl, bis{4-(4-aminophenoxy)phenyl}ether, 2,2'-dimethyl-4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl, 2,2',3,3'-tetramethyl-4,4'-diaminobiphenyl, 3,3',4,4'-tetramethyl-4,4'-diaminobiphenyl, and 2,2'-bis(trifluoromethyl)-4,4'-diaminobiphenyl; or compounds each resulting from replacing some hydrogen atoms of the aromatic ring of each of the foregoing by a $C_1$-$C_{10}$ alkyl group, a fluoroalkyl group, a halogen atom, or the like; alicyclic diamines such as cyclochexyldiamine and methylenebiscyclohexylamine; and the like. These diamines can be used directly or used in the form of the corresponding diisocyanate compounds or trimethylsilylated diamines.

It is also preferable to use aliphatic diamines. Examples of aliphatic diamines include ethylenediamine, 1,3-diaminopropane, 2-methyl-1,3-propanediamine, 1,4-diaminobutane, 1,5-diaminopentane, 2-methyl-1,5-diaminopentane, 1,6-diaminohexane, 1,7-diaminoheptane, 1,8-diaminooctane, 1,9-diaminononane, 1,10-diaminodecane, 1,11-diaminoundecane, 1,12-diaminododecane, 1,2-cyclohexanediamine, 1,3-cyclohexanediamine, 1,4-cyclohexanediamine, 1,2-bis (aminomethyl)cyclohexane, 1,3-bis(aminomethyl)cyclohexane, 1,4-bis(aminomethyl)cyclohexane, 4,4'-methylene bis(cyclohexylamine), 4,4'-methylene bis(2-methylcyclohexylamine), 1,2-bis(2-aminoethoxy)ethane, THF-100, THF-140, THF-170, RE-600, RE-900, RE-2000, RP-405, RP-409, RP-2005, RP-2009, RT-1000, HE-1000, HT-1100, HT-1700, JEFFAMINE KH-511, JEFFAMINE ED-600, JEFFAMINE ED-900, JEFFAMINE ED-2003, JEFFAMINE EDR-148, JEFFAMINE EDR-176, polyoxypropylenediamines of D-200, D-400, D-2000, and D-4000 (which are trade names, manufactured by HUNTSMAN Corporation), and the like. Some of the hydrogen atoms of these hydrocarbons may be substituted by a $C_1$-$C_{10}$ alkyl group, a fluoroalkyl group, a halogen atom, and the like. In addition, a bond such as —S—, —SO—, —SO$_2$—, —NH—, —NCH$_3$—, —N(CH$_2$CH$_3$)—, —N(CH$_2$CH$_2$CH$_3$)—, —N(CH(CH$_3$)$_2$)—, —COO—, —CONH—, —OCONH—, or —NHCONH— may be included in the molecule. The use of aliphatic alkyldiamines, among others, is preferable, because it imparts flexibility, which hence enhances the elongation at break of the cured resin film and lowers the elastic modulus thereof, thereby suppressing the warpage of the wafer. These characteristics are effective for making the cured resin film into a multilayered film or a thick film. In introducing an aliphatic alkyldiamine, the residue derived from the aliphatic alkyldiamine is preferably present at 10 mol % or more relative to all diamine derivative residues, and preferably at 50 mol % or less from the viewpoint of heat resistance. On the other hand, in applications in which heat resistance is required, it is preferred to use an aromatic diamine in an amount of 50 mol % or more relative to the total amount of the diamine components. Two or more kinds of these diamine components may also be used in combination.

The alkali-soluble resin including a structure represented by the general formula (2) preferably contains a phenolic hydroxyl group, sulfonic group, thiol group, or the like. In this case, $R^3$ and $R^4$ in the general formula (2) preferably contain a phenolic hydroxyl group, sulfonic group, thiol group, or the like. Using resins having these functional groups in appropriate amounts affords a photosensitive resin composition having an appropriate alkali solubility. Among others, a phenolic hydroxyl group is particularly preferably included. $R^3$ and $R^4$ may each include both a structure containing these functional groups and a structure not containing those.

In the general formula (2), $R^5$ represents hydrogen or a $C_1$-$C_{20}$ organic group. From the viewpoint of the solution stability of the obtained photosensitive resin composition solution, $R^5$ is preferably a hydrocarbon group, and from the viewpoint of the solubility into an alkali developing solution, hydrogen is preferable. It is also preferable to have hydrogen and a hydrocarbon group mixed together. Adjusting the amounts of hydrogen and hydrocarbon groups in $R^5$ results in changing the rate of dissolution of an alkali-soluble resin into an alkali aqueous solution, thus making it possible to obtain a photosensitive resin composition having an appropriate rate of dissolution. The preferable range for hydrogen is 10 mol % to 90 mol % of $R^5$. In addition, from the viewpoint of the solubility into an alkali developing solution, the carbon number of the organic group is 20 or less, more preferably 16 or less. Based on the aforementioned, it is preferable that $R^5$ contain one or more $C_1$-$C_{16}$ hydrocarbon groups and hydrogen as others.

The structure represented by the general formula (2) represents a polyimide in the case of l=0 and a polyimide precursor in the case of m=0. The cases of l>0 and m>0 represent a polyimide precursor a part of which is ring-closed and imidizated.

In the general formula (3), $R^6$ represents a $C_2$-$C_{40}$ bivalent organic group, and $R^7$ represents a $C_6$-$C_{40}$ tetravalent organic group. $R^6$ and $R^7$ each preferably have an aromatic ring and/or aliphatic ring. When the structure contains a plurality of $R^6$s and $R^7$s, $R^6$ and $R^7$ may each be composed of only a single structure or include a plurality of structures.

In the general formula (3), $R^6$ represents a dicarboxylic residue o a tetracarboxylic residue derived from a dicarboxylic acid or a tetracarboxylic acid which serves as a raw material for an alkali-soluble resin.

Examples of dicarboxylic acids include terephthalic acid, isophthalic acid, diphenyl ether dicarboxylic acid, bis(carboxyphenyl)hexafluoropropane, biphenyldicarboxylic acid, benzophenone dicarboxylic acid, triphenyldicarboxylic acid, and the like; and examples of tricarboxylic acids include trimellitic acid, trimesic acid, diphenyl ether tricarboxylic acid, biphenyltricarboxylic acid, and the like. Examples of tetracarboxylic acids are the same as the compounds listed above as examples for $R^3$. Two or more of them may be used in combination.

In the general formula (3), $R^7$ represents a bisaminophenol residue derived from a bisaminophenol which serves as a raw material for an alkali-soluble resin. Specific examples of bisaminophenols include, but are not limited to, 3,3'-diamino-4,4'-dihydroxybiphenyl, 4,4'-diamino-3,3'-dihydroxybiphenyl, bis(3-amino-4-hydroxyphenyl)propane bis(4-amino-3-hydroxy phenyl)propane, bis(3-amino-4-hydroxyphenyl)sulfone, bis(4-amino-3-hydroxy phenyl) sulfone, 2,2-bis(3-amino-4-hydroxy phenyl)-1,1,1,3,3,3-hexafluoropropane, 2,2-bis(4-amino-3-hydroxy phenyl)-1,1,1,3,3,3-hexafluoropropane, and the like. These compounds may be used singly, or in combination of two or more kinds thereof.

$R^7$ in the general formula (3) preferably contains a phenolic hydroxyl group in the structure thereof. This affords a photosensitive resin composition having an appropriate alkali solubility. The alkali-soluble resin may be a copolymer having a diamine residue containing a phenolic hydroxyl group, as $R^7$ in the general formula (3), and another diamine residue. Here, diamine residues having another structure are preferably diamine residues which do not contain hydroxyl group. For example, as diamines which contain no hydroxyl group, it is also preferable to use: sulfonic group-containing diamines such as 3-sulfonic acid-4,4'-diaminodiphenyl ether; thiol group-containing diamines such as dimercaptophenylenediamine; aromatic diamines such as 3,4'-diaminodiphenyl ether, 4,4'-diaminodiphenyl ether, 3,4'-diaminodiphenylmethane, 4,4'-diaminodiphenylmethane, 3,4'-diaminodiphenyl sulfone, 4,4'-diaminodiphenyl sulfone, 3,4'-diaminodiphenylsulfide, 4,4'-diaminodiphenylsulfide, 1,4-bis(4-aminophenoxy)benzene, benzidine, m-phenylenediamine, p-phenylenediamine, 1,5-naphthalenediamine, 2,6-naphthalenediamine, bis(4-aminophenoxyphenyl)sulfone, bis(3-aminophenoxyphenyl)sulfone, bis(4-aminophenoxy)biphenyl, bis{4-(4-aminophenoxy)phenyl}ether, 2,2'-dimethyl-4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl, 2,2',3,3'-tetramethyl-4,4'-diaminobiphenyl, 3,3',4,4'-tetramethyl-4,4'-diaminobiphenyl, and 2,2'-bis(trifluoromethyl)-4,4'-diaminobiphenyl; or compounds each resulting from replacing some hydrogen atoms of the aromatic ring of each of the foregoing by a $C_1$-$C_{10}$ alkyl group, a fluoroalkyl group, a halogen atom, or the like; and aliphatic diamines Examples of aliphatic diamines include ethylenediamine, 1,3-diaminopropane, 2-methyl-1,3-propanediamine, 1,4-diaminobutane, 1,5-diaminopentane, 2-methyl-1,5-diaminopentane, 1,6-diaminohexane, 1,7-diaminoheptane, 1,8-diaminooctane, 1,9-diaminononane, 1,10-diaminodecane, 1,11-diaminoundecane, 1,12-diaminododecane, 1,2-cyclohexanediamine, 1,3-cyclohexanediamine, 1,4-cyclohexanediamine, 1,2-bis(aminomethyl)cyclohexane, 1,3-bis(aminomethyl)cyclohexane, 1,4-bis(aminomethyl)cyclohexane, 4,4'-methylene bis(cyclohexylamine), 4,4'-methylene bis(2-methylcyclohexylamine), 1,2-bis(2-aminoethoxy)ethane, THF-100, THF-140, THF-170, RE-600, RE-900, RE-2000, RP-405, RP-409, RP-2005, RP-2009, RT-1000, HE-1000, HT-1100, HT-1700, JEFFAMINE (registered trademark) KH-511, JEFFAMINE (registered trademark) ED-600, JEFFAMINE (registered trademark) ED-900, JEFFAMINE (registered trademark) ED-2003, JEFFAMINE (registered trademark) EDR-148, JEFFAMINE (registered trademark) EDR-176, and polyoxypropylenediamines of D-200, D-400, D-2000, and D-4000 (which are trade names, manufactured by HUNTSMAN Corporation). Some of the hydrogen atoms of these hydrocarbons may be substituted by a $C_1$-$C_{10}$ alkyl group or fluoroalkyl group, a halogen atom, or the like, and the hydrocarbons may contain a bond such as —S—, —SO—, —SO$_2$—, —NH—, —NCH$_3$—, —N(CH$_2$CH$_3$)—, —N(CH$_2$CH$_2$CH$_3$)—, —N(CH(CH$_3$)$_2$)—, —COO—, —CONH—, —OCONH—, or —NHCONH—. The use of aliphatic alkyldiamines, among others, is preferable, because it imparts flexibility, which hence enhances the elongation at break and lowers the elastic modulus, thereby suppressing the warpage of the wafer. These characteristics are effective for a multilayered film and a thick film. In introducing an aliphatic alkyldiamine, the residue derived from the aliphatic alkyldiamine is preferably present at 10 mol % or more relative to all diamine residues, and preferably 50 mol % or less from the viewpoint of heat resistance. Examples of dicarboxylic acids are the same as the compounds listed above as examples for $R^6$. Two or more of them may be used in combination.

The structure represented by the general formula (3) represents a polybenzoxazole in the case of n=0 and a polybenzoxazole precursor in the case of o=O. In addition, the cases of n>0 and o>0 represent a polybenzoxazole precursor, a part of which is ring-closed to form a benzoxazole ring.

It is also preferable that the alkali-soluble resin be a copolymer having a structure represented by the general formula (2), a structure represented by the general formula (3), and an aliphatic polyamide structure and satisfy m>0 and n>0, in order to achieve a good adhesion to metal, sensitivity, and chemical resistance. The imide structure in the general formula (2) has a high intermolecular packing property, hence achieving a high chemical resistance effect. In addition, the phenolic hydroxyl group in the general formula (3) interacts with a photosensitizer, thereby achieving a high contrast between the exposed parts and the unexposed parts. The resin having a lower absorbance due to the aliphatic group polyamide structure has a higher sensitivity. In addition, the aliphatic polyamide structure which has no phenol group does not cause cyclodehydration during curing and has a high flexibility, so that adhesion reduction due to stress does not occur even after heat-curing. These characteristics derived from the structure do not easily achieve the effect in a resin mixture, so that the resin is preferably copolymerized.

In addition, capping the terminal of a resin represented by the general formula (2) or the general formula (3) with a compound selected from a monoamine, an acid anhydride, an acid chloride, and a monocarboxylic acid, which have an acidic group, can afford a resin having an acidic group at the main-chain terminal.

Preferred examples of the monoamine may include 5-amino-8-hydroxyquinoline, 1-hydroxy-7-aminonaphthalene, 1-hydroxy-6-aminonaphthalene, 1-hydroxy-5-aminonaphthalene, 1-hydroxy-4-aminonaphthalene, 2-hydroxy-7-aminonaphthalene, 2-hydroxy-6-aminonaphthalene, 2-hydroxy-5-aminonaphthalene, 1-carboxy-7-aminonaphthalene, 1-carboxy-6-aminonaphthalene, 1-carboxy-5-aminonaphthalene, 2-carboxy-7-aminonaphthalene, 2-carboxy-6-aminonaphthalene, 2-carboxy-5-aminonaphthalene, 2-aminobenzoic acid, 3-aminobenzoic acid, 4-aminobenzoic acid, 4-aminosalicylic acid, 5-aminosalicylic acid, 6-aminosalicylic acid, 2-aminobenzenesulfonic acid, 3-aminobenzenesulfonic acid, 4-aminobenzenesulfonic acid, 3-amino-4,6-dihydroxypyrimidine, 2-aminophenol, 3-aminophenol, 4-aminophenol, 2-aminothiophenol, 3-aminothiophenol, and 4-aminothiophenol. Two or more of them may be used in combination.

Preferred examples of acid anhydrides, acid chlorides, and monocarboxylic acids may include acid anhydrides such as phthalic anhydride, maleic anhydride, nadic anhydride, cyclohexanedicarboxylic anhydride, and 3-hydroxyphthalic anhydride; monocarboxylic acids such as 3-carboxyphenol, 4-carboxyphenol, 3-carboxythiophenol, 4-carboxythiophenol, 1-hydroxy-7-carboxynaphthalene, 1-hydroxy-6-carboxynaphthalene, 1-hydroxy-5-carboxynaphthalene, 1-mercapto-7-carboxynaphthalene, 1-mercapto-6-carboxynaphthalene, 1-mercapto-5-carboxynaphthalene, 3-carboxybenzenesulfonic acid, and 4-carboxybenzenesulfonic acid; monoacid chloride compounds with the carboxyl group of the monocarboxylic acid formed into an acid chloride; monoacid chloride compounds with only one carboxy group of dicarboxylic acids such as terephthalic acid, phthalic acid, maleic acid, cyclohexanedicarboxylic acid, 1,5-dicarboxynaphthalene, 1,6-dicarboxynaphthalene, 1,7-dicarboxynaphthalene, and 2,6-dicarboxynaphthalene formed into an acid chloride; and active ester compounds obtained by reaction of a monoacid chloride compound with N-hydroxybenzotriazole and N-hydroxy-5-norbornene-2,3-dicarboxyimide. Two or more of them may be used in combination.

The terminal-capping agent introduced into the resin can be detected easily by the following methods. For example, a resin having a terminal-capping agent introduced thereinto is dissolved in an acidic solution to decompose the resin into an amine component and an acid component which are constituent units of the resin, and these components are subjected to a measurement by gas chromatography (GC) or NMR to detect the terminal-capping agent easily. Alternatively, a resin having a terminal-capping agent introduced thereinto may be directly subjected to a measurement by thermal decomposition gas chromatography (PGC) or infrared or $^{13}$C-NMR spectroscopy to detect the terminal-capping agent.

In addition, the photosensitive resin composition according to the present invention may contain another alkali-soluble resin than an alkali-soluble resin selected from a polyimide, a polybenzoxazole, a polyimide precursor, a polybenzoxazole precursor, and a copolymer of two or more kinds of polymers selected therefrom. The "another alkali-soluble resin" refers to a resin having an acidic group which is soluble in alkali. Specific examples include: radical polymerizable resins having an acrylic acid, phenol-novolac resins, resole resins, polyhydroxy styrene, and polysiloxane; resins with crosslinking groups, such as methylol group, alkoxymethyl groups, epoxy groups, and acryl group, introduced thereinto; copolymerize polymers thereof; and the like. In addition, the acidic groups of these resins may be protected to regulate the alkali solubility. Such resins dissolve in an alkali aqueous solution such as of choline, triethylamine, dimethylaminopyridine, monoethanolamine, diethylamino ethanol, sodium hydroxide, potassium hydroxide, sodium carbonate, or the like as well as tetramethylammonium hydroxide. Two or more of these resins may be contained. The portion of these other alkali-soluble resins in all alkali-soluble resins is preferably 70 wt % or less. The photosensitive resin composition containing these other alkali-soluble resins allows the characteristics of the alkali-soluble resins to be adjusted while maintaining the adhesion and excellent sensitivity of the cured resin film.

In addition, the structural units of the aforementioned alkali-soluble resins preferably contain a fluorine atom. The fluorine atom contained imparts water repellency to a surface of the cured resin film during development with an alkali aqueous solution, thus enabling the permeation of the developing solution from the surface of the cured resin film to be suppressed. The suppression of permeation of the solvent enables the cured resin film to have an excellent chemical resistance.

In this case, the alkali-soluble resin represented by the general formula (2) preferably contains 30 mol % or more organic groups containing a fluorine atom active to the total amount of the organic groups represented by $R^3$ and $R^4$ as 100 mol %. This enables the sufficient achievement of the effect of fluorine for suppressing the permeation of a solvent or water and can afford chemical resistance and a high adhesion effect even under high humidity. The preferable range of the content of organic groups containing a fluorine atom is from 30 mol % to 90 mol % from the viewpoint of chemical resistance and alkali developability.

For the same reason, the alkali-soluble resin represented by the general formula (3) preferably contains 30 mol % or more organic groups containing a fluorine atom relative to the total amount of the organic groups represented by $R^6$ and $R^7$ as 100 mol %, and the more preferable range is from 30 mol % to 90 mol %.

The photosensitive resin composition preferably contains a crosslinking agent. The photosensitive resin composition containing a crosslinking agent can enhance the film strength of the obtained cured resin film and enables the cured resin film to have an excellent chemical resistance. Generally, in a resin composition including a large amount of a crosslinking agent, crosslinking among polymers is facilitated and thus the strength and chemical resistance of the cured resin film itself are enhanced, but the interaction with a substrate is reduced, so that the adhesion to the substrate may unfavorably be reduced. In particular, when the composition is baked at low temperature, it may unfavorably have remaining additives and hence tends to have an even lower adhesion. The resin composition according to the present invention contains a compound represented by the general formula (1), and hence can ensure adhesion to a substrate even when having a crosslink agent added to the composition to thereby enhance film strength, and accordingly a cured resin film having a high chemical resistance can be obtained.

The crosslinking agent is preferably a compound having, at least two alkoxymethyl groups or methylol groups, and examples thereof include DML-PC, DML-PEP, DML-OC, DML-OEP, DML-34X, DML-PTBP, DML-PCHP, DML-OCHP, DML-PFP, DML-PSBP, DML-POP, DML-MBOC, DML-MBPC, DML-MTrisPC, DML-BisOC-Z DMLBisO-CHP-Z, DML-BPC, DML-BisOC-P, DMOM-PC, DMOM-PTBP, DMOM-MBPC, TriML-P, TriML-35XL, TML-HQ, TML-BP, TML-pp-BPF, TML-BPE, TML-BPA, TML- BPAF, TML-BPAP, TMOM-BP, TMOM-BPE, TMOM-BPA, TMOM-BPAF, TMOM-BPAP, HML-TPPHBA, HML-TPHAP, HMOM-TPPHBA, HMOM-TPHAP (which are trade names, manufactured by Honshu Chemical Industry Co., Ltd), NIKALAC (registered trademark) MX-290, MX-280, MX-270, MX-279, MW-100LM, and MX-750LM (which are trade names, manufactured by Sanwa Chemical Co., Ltd.). Among these, a compound having at least four alkoxymethyl groups or methylol groups is more preferable and a compound having six of them is further preferable.

In addition, a compound having an epoxy group is thermally crosslinked with a polymer at 200° C. or less, does not undergo a dehydration reaction caused by crosslinking, hence is less likely to undergo film shrinkage, and thus is effective in low temperature curing and warpage reduction as well as mechanical characteristics. Examples of compounds having an epoxy group include, but are not limited to, epoxy-group-containing silicones such as bisphenol A epoxy resins, bisphenol F epoxy resins, propylene glycol diglycidyl ether, polypropylene glycol diglycidyl ether, and polymethyl(glycidyloxypropyl)siloxane; and the like. Specific examples include EPICLON (registered trademark) 850-S, HP-4032, HP-7200, HP-820, HP-4700, EXA-4710, HP-4770, EXA-859CRP, EXA-1514, EXA-4880, EXA-4850-150, EXA-4850-1000, EXA-4816, EXA-4822 (which are trade names, manufactured by Dainippon Ink and Chemicals Inc.), RIKARESIN (registered trademark) BEO-60E (which is a trade name, manufactured by New Japan Chemical Co., Ltd.), EP-4003S, EP-4000S (which are trade names, manufactured by ADEKA CORPORATION), and the like.

The resin composition may contain two or more kinds of the crosslinking agents. The content of the crosslinking agent is preferably 0.5 parts by weight or more, more preferably 1 part by weight or more, still more preferably 5 parts by weight or more, further preferably 24 parts by weight or more, relative to 100 parts by weight of the alkali-soluble resin. The content of the crosslinking agent is preferably 300 parts by weight or less, more preferably 200 parts by weight or less, further preferably 150 parts by weight or less, relative to 100 parts by weight of the alkali-soluble resin. These contents are preferable because of making it possible to enhance the adhesion to a substrate while achieving the strength and chemical resistance of the cured resin film itself.

In addition, in order to enhance the sensitivity of the photosensitive resin composition, the composition may contain, if necessary, a compound having a phenolic hydroxyl group to the extent of not reducing the shrinkage ratio after curing.

Examples of compounds having a phenolic hydroxyl group include Bis-Z, BisOC-Z, BisOPP-Z, BisP-CP, Bis26X-Z, BisOTBP-Z, BisOCHP-Z, BisOCR-CP, BisP-MZ, BisP-EZ, Bis26X-CP, BisP-PZ, BisP-IPZ, BisCR-IPZ, BisOCP-IPZ, BisOIPP-CP, Bis26X-IPZ, BisOTBP-CP, TekP-4HBPA (tetrakis P-DO-BPA), TrisP-HAP, TrisP-PA, TrisP-SA, TrisOCR-PA, BisOFP-Z, BisRS-2P, BisPG-26X, BisRS-3P, BisOC-OCHP, BisPC-OCHP, Bis25X-OCHP, Bis26X-OCHP, BisOCHP-OC, Bis236T-OCHP, Methylenetris-FR-CR, BisRS-26X, BisRS-OCHP (which are trade names, manufactured by Honshu Chemical Industry Co. Ltd.), BIR-OC, BIP-PC, BIR-PC, BIR-PTBP, BIR PCHP, BIP-BIOC-F, 4PC, BIR-BIPC-F, and TEP-BIP-A (which are trade names, manufactured by Asahi Yukizai Corporation).

Among these, examples of compounds having a preferable phenolic hydroxyl group include Bis-Z, BisP-EZ, TekP-4HBPA, TrisP-HAP, TrisP-PA, BisOCHP-Z, BisP-MZ, BisP-PZ, BisP-IPZ, BisOCP-IPZ, BisP-CP, BisRS-2P, BisRS-3P, BisP-OCHP, methylenetris-FR-CR, BisRS-26X, BIP-PC, BIR-PC, BIR-PTBP, BIR-BIPC-F, and the like. Among these, the compounds having a particularly preferable phenolic hydroxyl group are Bis-Z, TekP-4HBPA, TrisP-HAP, TrisP-PA, BisRS-2P, BisRS-3P, BIR-PC, BIR-PTBP, and BIR-BIPC-F. The resin composition resulting from containing a compound having a phenolic hydroxyl group is hardly dissolved in an alkali developing solution before light exposure, and is easily dissolved in an alkali developing solution once exposed to light, because the reduction of the film by development is low, and development becomes easy after a short time.

The content of such a compound having a phenolic hydroxyl group is preferably in the range of 1 to 50 parts by weight, more, preferably 1 to 30 parts by weight, relative to 100 parts by weight of the alkali-soluble resin. Preferably, in this content range, the compound having a phenolic hydroxyl group interacts with the polymers, thereby causing a high dissolution contrast to be achieved between the exposed parts and the unexposed parts during development, and thus enhancing sensitivity.

Preferably, the photosensitive resin composition further contains a solvent. Examples of solvents include: polar aprotic solvents such as N-methyl-2-pyrrolidone, γ-butyrolactone, N,N-dimethylformamide, N,N-dimethylacetamide and dimethyl sulfoxide; ethers such as tetrahydrofuran, dioxane, and propylene glycol monomethyl ether; ketones such as acetone methyl ethyl ketone, diisobutyl ketone, and diacetone alcohol; esters such as ethyl acetate, propylene glycol monomethyl ether acetate, 3-methoxymethylpropanate, 3-ethoxyethylpropanate, and ethyl lactate; and aromatic hydrocarbons such as toluene and xylene. The photosensitive resin composition may contain two or more kinds of these. The content of the solvent is preferably 100 to 1500 parts by weight relative to 100 parts by weight of the alkali-soluble resin.

The photosensitive resin composition can further contain a silane compound. The photosensitive resin composition containing a silane compound enhances the adhesion of the cured resin film Specific examples of silane compounds can include N-phenylaminoethyltrimethoxysilane, N-phenylaminoethyltriethoxysilane, N-phenylaminopropyltrimethoxysilane, N-phenylaminopropyltriethoxysilane, N-phenylambobutyltrimethoxysilane, N-phenylaminobutyltriethoxysilane, vinyltrimethoxysilane, vinyltriethoxysilane, vinyltrichlorsilane, vinyltris(β-methoxyethoxy)silane, 3-methacryloxypropyltrimethoxysilane, 3-acryloxypropyltrimethoxysilane, p-styryltrimethoxysilane, 3-methacryloxypropylmethyldiethoxysilane, 3-methacryloxypropylmethyldiethoxysilane. The content of the silane compound is preferably 0.01 to 15 parts by weight relative to 100 parts by weight of the alkali-soluble resin.

Further, for the purpose of enhancing the wettability with a substrate, the photosensitive resin composition may contain a surfactant, if necessary. Moreover, for the purposes of suppressing the thermal expansion coefficient, increasing the dielectric constant, lowering the dielectric constant, or doing other things, the photosensitive resin composition may contain inorganic particles such as of silicon dioxide and titanium dioxide, powder of polyimide, or the like.

Next, a method for producing the photosensitive resin composition according to the present invention will be described. Examples of methods include: a method in which to add an alkali-soluble resin, a photosensitizer, and other components, if necessary, to a glass flask or a stainless steel container and dissolve them with stirring with a mechanical stirrer or the like; a method in which to dissolve them by ultrasonication; a method in which to dissolve them with stirring with a planetary stirring deaerator. The photosensitive resin composition preferably has a viscosity of 1 to 10,000 mPa·s. In addition, the photosensitive resin composition may be filtered through a filter having a pore size of 0.1 μm to 5 μm in order to remove foreign matter.

Next, a method for forming a pattern of a cured resin film using the photosensitive resin composition according to the present invention will be described.

A pattern of a cured resin film can be obtained through the steps of: coating a substrate with the photosensitive resin composition and drying the composition to obtain a resin film; exposing the resin film obtained from the previous step; developing the exposed resin film using an alkali aqueous solution to form a pattern out of the resin film; and heating the developed resin film.

First, a substrate is coated with the photosensitive resin composition. Examples of substrate materials used include, but are not limited to, silicon, ceramics, gallium arsenic, metal, glass, metal oxide insulating films, silicon nitride, ITO, and the like. As a substrate, a sealing resin substrate or the like with a silicon chip or the like embedded in a sealing resin such as an epoxy resin can also be used. The photosensitive resin composition according to the present invention has an excellent adhesion to a metal, particularly copper, and hence achieves a great effect when applied to a substrate including a metal, among others. Above all, the photosensitive resin composition is preferably used for application to a substrate with metal wiring formed thereon, and farther, the metal wiring is preferably wires including copper.

In order to enhance the adhesion between a substrate and the photosensitive resin composition, the substrate can also be pretreated with a silane coupling agent. For example, the surface of a substrate is coated with a solution of 0.5 to 20% by mass silane coupling agent dissolved in a solvent such as isopropanol, ethanol, methanol, water, tetrahydrofuran, propylene glycol monomethyl ether acetate, propylene glycol monomethyl ether, ethyl lactate, or diethyl adipate, by a method such as spin coating, immersing, spray coating, or treatment with steam. Then, depending on the case, heat treatment at 50° C. to 300° C. is carried out to advance the reaction between the substrate and the silane coupling agent.

Examples of coating methods include methods such as spin coating using a spinner, spray coating, roll coating, and slit die coating. The thickness of the coated film depends on the coating technique, the solid concentration of the photosensitive resin composition, the viscosity, and the like, and coating is generally carried out such that the thickness of the dried film is 0.1 to 150 μm.

Next, the substrate coated with the photosensitive resin composition is dried to afford a photosensitive resin film. It is preferable to carry out the drying at 50° C. to 150° C. for one minute to several hours using an oven, a hotplate, infrared ray or the like.

The dried photosensitive resin composition may be released from the substrate to be used as a photosensitive uncured sheet. The photosensitive uncured sheet refers to a sheet shaped product that is composed of the photosensitive resin composition and is not cured.

Next, this photosensitive resin film or photosensitive uncured sheet (hereinafter referred to collectively as a resin film) are irradiated with actinic rays through a mask having a desired pattern. Examples of actinic rays, used for light exposure include ultraviolet rays, visible rays, electron rays, X-rays, and the like, and i-rays (365 nm), h-rays (405 nm), and g-rays (436 nm) of a mercury lamp and the like are preferably used.

To form a pattern out of the resin film, the dissolved parts have only to be removed using a developing solution after light exposure. In the developing step, exposed parts are dissolved for a positive-working photosensitive resin composition pattern, and unexposed parts are dissolved for a negative-working photosensitive resin composition pattern.

A developing solution is preferably an aqueous solution of a compound having alkalinity, such as tetramethylammonium, hydroxide, diethanolamine, diethylaminoethanol, sodium hydroxide, potassium hydroxide, sodium carbonate, potassium carbonate, triethylamine, diethylamine methylamine, dimethylamine, dimethylaminoethyl dimethylaminoethanol, dimethylaminoethyl methacrylate, cyclohexylamine, ethylenediamine and hexamethylenediamine. In some cases, to these alkali aqueous solutions, one or more kinds of: polar solvents such as N-methyl-2-pyrrolidone, N,N-dimethylformamide, N,N-dimethylacetamide, dimethyl sulfoxide, γ-butyrolactone, and dimethylacrylamide; alcohols such as methanol, ethanol, and isopropanol; esters such as ethyl lactate and propylene glycol monomethyl ether acetate; ketones such as cyclopentanone, cyclohexanone, isobutyl ketone, and methyl isobutyl ketone; and the like may be added. After the development, a rinsing treatment with water is generally carried out. In the rinsing treatment, one or more kinds of: alcohols such as ethanol and isopropyl alcohol; esters such as ethyl lactate, propylene glycol monomethyl ether acetate, 3-methoxymethylpropanate; and the like may be added to water.

After the development, the developed resin film is converted into a cured resin film by heating at a temperature 150° C. to 500° C. This heat treatment is preferably carried out for 5 minutes to 5 hours while raising temperature in a stepwise manner or while raising temperature continuously. As one example, the heat treatment is performed at 130° C. and 250° C., each for 30 minutes, or performed by raising temperature linearly from room temperature to 250° C. in 2 hours. The heat treatment is preferably carried out at 250° C. or less because high temperature heating and repetitions thereof may unfavorably change the electrical characteristics of the element and may unfavorably increase the warpage of the substrate. In addition, the heat treatment is more preferably carried out at 150° C. or more in order for the crosslinking to achieve impartation of chemical resistance and interaction between an adhesion-improving agent and the substrate. The resin composition in the present invention can afford a cured resin film having an excellent adhesion and chemical resistance even when baked at a low temperature of 250° C. or less.

The cured resin film formed out of the photosensitive resin composition according to the present invention can be used for electronic components of semiconductor devices and the like. The semiconductor devices mentioned in the present invention refer to devices in general which can function by utilizing the characteristics of semiconductor elements. Electrical optical devices and semiconductor circuit boards which both have semiconductor elements connected to a substrate, layered multiple semiconductor elements, and electronic devices including these are all encompassed in semiconductor devices. In addition, electronic components such as multilayer wiring boards for connecting semiconductor elements are encompassed in semiconductor devices. Specifically, the cured resin film is preferably used for applications such as passivation films for semiconductors, surface protective films for semiconductor elements, interlayer dielectric films between semiconductor elements and wiring, interlayer dielectric films between a plurality of semiconductor elements, interlayer dielectric films between wiring interlayers of multilayer wiring for high-density packaging, and insulating layers of organic electroluminescence elements, but is not limited thereto and used for various applications.

Next, examples of application of the photosensitive resin composition according to the present invention to semiconductor devices having a bump will be described with reference to the drawings. FIG. 1 is an enlarged cross-section view of a pad portion of a semiconductor device having a bump. As shown in FIG. 1, a passivation film 3 over an Al pad 2 for input and output is formed on a silicon wafer 1, and via holes are formed in the passivation film 3. Further on this, an insulating film 4 formed using the photosensitive resin composition according to the present invention is formed, and a metal film 5 composed of Cr, Ti, or the like is further formed so as to be connected to the Al pad 2. By etching the metal film 5 around a solder bump 10, the pads are insulated from one another. On the insulated pad, a barrier metal 8 and the solder bump 10 are formed. When a softening component is introduced into the photosensitive resin composition, wafer warpage is small, and hence light exposure and wafer transport can be carried out with high precision. In addition, polyimide resins and polybenzoxazole resins also have excellent mechanical characteristics and hence can relieve stress coming from a sealing resin even during packaging, accordingly prevent the low-k layer from being damaged, and provide semiconductor devices having a high reliability.

Next, a method for making a semiconductor device will be described in detail. In the process of 2a in FIG. 2, a silicon wafer 1 with an Al pad 2 and a passivation film 3 formed thereon is coated with the photosensitive resin composition according to the present invention, and undergoes a photolithography process to form a pattern formed insulating film 4. Then, in the process of 2b, a metal film 5 is formed by a sputtering method. As shown by 2c in FIG. 2, metal wiring 6 is formed as a film on the metal film 5 by a plating method. Next, as shown by 2d' in FIG. 2, the film is coated with the photosensitive resin composition according to the present invention, and undergoes a photolithography process to form an insulating film 7 as a pattern as shown by 2d in FIG. 2. During this, the photosensitive resin composition as the insulating film 7 undergoes thick film processing at a scribe line 9. Further wiring (so-called rewiring) can be formed on the insulating film 7. For forming a bilayer or more multilayer wiring structure, the aforementioned processes are repeated, whereby a multilayer wiring structure having two or ore rewiring layers separated by an interlayer dielectric film obtained from the resin composition according to the present invention can be formed. During this, the insulating film formed has to come into contact with various liquid chemicals a plurality of times, but the insulating film obtained from the resin composition according to the present invention has an excellent adhesion and chemical resistance, and hence can form a favorable multilayer wiring structure. The number of layers of the multilayer wiring structure has no upper limit but those having 10 or less layers are often used.

Then, as shown by 2e and 2f in FIG. 2, a barrier metal 8 and a solder bump 10 are formed. Then, the structure is diced along scribe lines 9 to be cut into individual chips. When the insulating film 7 has no pattern formed at the scribe lines 9 or has some residues there, cracks and the like are generated during dicing and affect the reliability of the chips. Because of this, the capability to provide an excellent thick film processing in pattern processing, as in the present invention, is very preferable for achieving the high reliability of semiconductor devices.

In addition, the photosensitive resin composition according to the present invention is preferably used for fan-out wafer level packages (fan-out WLP). A fan-out WLP is a semiconductor package in which a necessary number of terminals are ensured by providing the periphery of the semiconductor chip with a part extended using a sealing resin such as an epoxy resin, attaching rewiring from the electrode to the extended part on the semiconductor chip, and mounting a solder ball on the extended part also. In the fan-out WLP, wiring is installed so as to be across the borderline formed by the principal surface of the semiconductor chip and the principal surface of the sealing resin. In other words, the interlayer dielectric film is formed on a base material composed of two or more kinds of materials, i.e., a semiconductor chip and a sealing resin with metal wiring disposed on them, and wiring is formed on the interlayer dielectric film. Other than this, a semiconductor package of the type that has a semiconductor chip embedded in a concave part which is formed in a glass epoxy resin substrate has wiring installed so as to be across the borderline between the principal surface of the semiconductor chip and the principal surface of the printed board. Also in this aspect, an interlayer dielectric film is formed on a substrate composed of two or more kinds of materials, and wiring is formed on the interlayer dielectric film. A cured film formed by curing the photosensitive resin composition according to the present invention has a high adhesion to a semiconductor chip with metal wiring, and also has a high adhesion to a sealing resin such as an epoxy resin, and hence is preferably used as an interlayer dielectric film laid on a substrate composed of two or more kinds of materials.

EXAMPLES

The present invention will be described below by way of Examples and the like, but the present invention is not limited by these Examples. The evaluations of the resins and photosensitive resin compositions in the examples were carried out by the methods mentioned below.

(1) Adhesion Test

The adhesion to in al materials were tested by the following method.

<Making of Cured Film>

Copper was sputtered onto a silicon wafer to prepare a substrate having a metal material layer 200 nm thick formed on the surface (copper-sputtered substrate). Varnish was applied onto this substrate by a spin-coating method using a spinner (manufactured by Mikasa Co., Ltd.), and then baked in the hot plate (D-SPIN, manufactured by Dai Nippon Screen Manufacturing Co., Ltd) at 120° C. for 3 minutes to make a prebaked film which was finally 8 µm thick. For a negative-working photosensitive resin composition, the whole surface of the substrate is then exposed to light at a light exposure amount of 1000 mJ/cm$^2$ using the exposure machine, the i-line stepper NSR-2005i9C (manufactured by Nikon Corporation). These films were cured under a nitrogen stream (the oxygen concentration: 20 ppm or less) using the clean oven (CLH-21CD-S, manufactured by Koyo Thermo Systems Co., Ltd.) at 140° C. for 30 minutes and then at a raised temperature of 200° C. for further one hour to afford a cured resin film.

<Adhesion Characteristics Evaluation>

The substrate was divided into two portions, and a single edged knife was used to make an incision in the form of a grid of 10 columns and 10 rows in the cured film on each substrate, each column and each row being 2 mm wide. One of the sample substrates was used to count how many out of the 100 cells were removed by peeling-off using Cello-tape (registered trademark), and was evaluated for the adhesion characteristics between the metal material and the cured resin film. On the other hand, the pressure cooker test (PCT) device (HAST CHAMBER EHS-211MD, manufactured by Tabai Espec Corporation) was used to treat the other sample substrate for PCT under the saturation conditions at 121° C. at 2 atmospheres for 400 hours, and then the peeling-off test as aforementioned was carried out. Each substrate was rated good if the number of pieces peeled thereoff in the peeling-off test was less than 20, and not good if 20 or more.

(2) Method for Measuring Film Thickness

After the prebaking, the thicknesses of the prebaked films were measured using the Lambda Ace STM-602 manufactured by Dainippon Screen Manufacturing Co. Ltd. under the assumption that the refractive index was 1.629, and the thicknesses of the cured films were measured under the assumption that the refractive index was 1.773.

(3) Evaluation of Sensitivity

<Making of Developed Film>

Varnish was spin-coated on an 8-inch silicon wafer, and then baked using the hot plate (the coater/developer "Act-8", manufactured by Tokyo Electron Limited) at 120° C. for 3 minutes to produce a prebaked film having a thickness of 10 µm. This film was exposed to light using the exposure machine, the i-line stepper, at a light exposure amount of 0 to 1000 $mJ/cm^2$ at a 10 $mJ/cm^2$ step. After the exposure to light, the resultant film was developed with a 2.38 wt % tetramethylammonium hydroxide (TMAH) aqueous solution (ELM-D, manufactured by Mitsubishi Gas Chemical Company, Inc.) for 90 seconds, and was then rinsed with pure water to afford a developed film A.

<Calculation of Sensitivity>

The pattern of the developed film A obtained by the aforementioned method was observed using the FDP microscope MX61 (manufactured by Olympus Corporation) at a magnification ratio of 20×, and the lowest necessary light exposure amount Eth for a line pattern of a mask size of 200 µm to open was determined and defined as sensitivity. The case where Eth is less than 350 $mJ/cm^2$ was rated very good (A), the case where Eth is 350 $mJ/cm^2$ or more but less than 500 $mJ/cm^2$ was rated good (B), and the case where Eth is 500 $mJ/cm^2$ or more was rated unacceptable (C).

<Evaluation of Chemical Resistance>

Varnish was applied to a 6-inch silicon wafer by a spin-coating method using the coating/developing device Mark-7 such that the thickness of the prebaked film was 11 µm, prebaked at 120° C. for 3 minutes, then heated using the inert oven CLH-21CD-S (manufactured by Koyo Thermo Systems Co., Ltd.) to 200° C. at 3.5° C./minute at an oxygen concentration of 20 ppm or less, and heated at 200° C. for one hour. When the temperature became 50° C. or less, the wafer was taken out and the film thickness was measured. This wafer was immersed in a solvent (dimethyl sulfoxide) at 70° C. for 100 minutes. After the wafer taken out of the solvent was cleaned with pure water, the film thickness was measured again, and a film whose rate of change in thickness between before and after the immersion thereof into the solvent was more than 15% in absolute value and one having a cured film peeled-off were rated as having a chemical resistance that was insufficient (C), one with more than 10% but 15% or less as satisfactory (B), and one with 10% or less as good (A).

[Synthesis Example 1] Synthesis of Alkali-Soluble Polyimide (A-1)

Under a dry nitrogen stream, 29.30 g (0.08 mol) of 2,2-bis(3-amino-4-hydroxyphenyl)hexafluoropropane (hereinafter referred to as BAHF) 1.24 g (0.005 mol) of 1,3-bis(3-aminopropyl)tetramethyl disiloxane, and 3.27 g (0.03 mol) of 4-aminophenol (manufactured by Tokyo Chemical Industry Co., Ltd.) as a terminal capping agent were dissolved in 239 g of N-methyl-2-pyrrolidone (hereinafter NMP). To this, 31.02 g (0.1 mol) of bis(3,4-dicarboxyphenyl)ether dianhydride (hereinafter referred to as ODPA, manufactured by Manac Incorporated) together with 20 g of NMP was added, reacted at 20° C. for one hour, and then reacted at 50° C. for 4 hours. After this, 15 g of xylene was added, and stirred at 150° C. for 5 hours while making water azeotropic with xylene. After completion of the stirring, the solution was allowed to cool and introduced into 3 L of water to afford a white precipitate. This precipitate was collected by filtration, washed with water 3 times, dried in a vacuum dryer at 80° C. for 20 hours to afford a powder of an alkali-soluble polyimide resin (A-1).

[Synthesis Example 2] Synthesis of Alkali-Soluble Polyimide (A-2)

The polymerization reaction was carried out in the same manner as Synthesis Example 1 to afford a powder of an alkali-soluble polyimide resin (A-2) except that the diamines were changed to 20.14 g (0.053 mol) of BAHF, 19.80 g (0.022 mol) of JEFFAMINE ED-900 which is a diamine having a polyethylene oxide group, and 1.24 g (0.005 mol) of 1,3-bis(3-aminopropyl)tetramethyldisiloxane.

[Synthesis Example 3] Synthesis of Polyamic Acid Ester (A-3)

Under a dry nitrogen stream, 31.02 g (0.1 mol) of ODPA was dissolved in 205 g of NMP. To this, 11.01 g (0.055 mol) of 4,4'-diaminodiphenyl ether, 7.33 g of (0.02 mol) of BAHF, 1.24 g (0.005 mol) of 1,3-bis(3-aminopropyl)tetramethyldisiloxane, together with 5 g of NMP, were added, reacted at 20° C. for one hour, and then reacted at 50° C. for 2 hours. Then, 4.37 g (0.04 mol) of 4-aminophenol as a terminal-capping agent, together with 10 g of NMP, was added and reacted at 50° C. for 2 hours. Subsequently, a solution prepared by diluting 21.45 g (0.18 mol) of N,N-dimethylformamide dimethyl acetal with 20 g of NMP was dropwisely added to the solution over 10 minutes. After the dropwise addition, the solution was stirred at 50° C. for 3 hours. After completion of the stirring, the solution was cooled to room temperature and the solution was poured into 3 L of water to afford a white precipitate. This precipitate was collected by filtration, washed with water 3 times, dried in a vacuum dryer at 80° C. for 20 hours to afford powder of a polyamic acid ester (polyimide precursor) (A-3).

[Synthesis Example 4] Synthesis of Polybenzoxazole Precursor (A-4)

Under a dry nitrogen stream, 18.3 g (0.05 mol) of BAHF was dissolved in 50 g of NMP and 26.4 g (0.3 mol) of glycidylmethyl ether, and the solution was cooled to a temperature of −15° C. Into this, a solution of 14.7 g of diphenyl ether dicarboxylic dichloride (manufactured by Nikon Nohyaku Co., Ltd., 0.050 mol) dissolved in 25 g of γ-butyrolactone was dropwisely added in such a manner that the temperature in the reaction system was not higher than 0° C. After completion of the dropwise addition, the solution continued to be stirred at −15° C. for 6 hours. After completion of the reaction, the solution was poured into 3 L of water including 10 wt % methanol to precipitate a white precipitate. This precipitate was collected by filtration, washed with water 3 times, dried in a vacuum dryer at 50° C. for 72 hours to afford a powder of an alkali-soluble polybenzoxazole precursor (A-4).

[Synthesis Example 5] Synthesis of Alkali-Soluble Polyimide (A-5)

Under a dry nitrogen stream, 14.65 g (0.04 mol) of BAHF, 11.21 (0.04 mol) of 2,2-bis(3-amino-4-hydroxyphenyl)sulfone (hereinafter referred to as ABPS), and 1.24 g (0.005 mol) of 1,3-bis(3-aminopropyl)tetramethyldisiloxane were dissolved in 239 g of NMP. To this, 31.02 g (0.1 mol) of ODPA together with 20 g of NMP was added, reacted at 20° C. for one hour, and then reacted at 50° C. for 4 hours. After this, 15 g of xylene was added, and stirred at 150° C. for 5 hours while making water azeotropic with xylene. After completion of the stirring, the solution was allowed to cool and introduced into 3 L of water to afford a white precipitate. This precipitate was collected by filtration, washed with water 3 times, dried in a vacuum dryer at 80° C. for 20 hours to afford a powder of an alkali-soluble polyimide resin (A-5).

[Synthesis Example 6] Synthesis of Novolac Resin (A-6)

Under a dry nitrogen stream, 70.2 g (0.65 mol) of m-cresol, 37.8 g (0.35 mol) of p-cresol, 75.5 g of 37 wt % formaldehyde aqueous solution (0.93 mol of formaldehyde), 0.63 g (0.005 mol) of oxalic acid dihydrate, and 264 g of methyl isobutyl ketone were charged into a reaction container, which was then immersed in an oil bath, and the reaction solution was held at reflux to undergo a polycondensation reaction for 4 hours. Subsequently, the temperature of the oil bath was raised over 3 hours, then the inner pressure of the flask was reduced to 40 to 67 hPa to remove a volatile component. The dissolved resin was cooled to room temperature to afford a polymer solid material of an alkali-soluble novolac resin (A-6).

[Synthesis Example 7] Synthesis of Polyhydroxystyrene Resin (A-7)

To a mixed solution of tetrahydrofuran (500 ml) and sec-butyllithium (0.01 mol) that served as an initiator, p-t-butoxystyrene and styrene were added at a molar ratio of 3:1 in a total amount of 20 g, and then the resultant solution was polymerized at 120° C. for 3 hours with stirring. A polymerization termination reaction was carried out by adding methanol (0.1 mol) to the reaction solution.

Subsequently, for the purpose of purifying the polymer, the reaction mixture was poured into methanol to precipitate a polymer, which was dried to afford a white polymer. Further, the polymer was dissolved in 400 ml of acetone, a small volume of concentrated hydrochloric acid was added thereto at 60° C., the resultant solution was stirred for 7 hours and then poured into water to precipitate a polymer, and the p-t-butoxystyrene was deprotected and converted to hydroxystyrene, which was washed and dried to afford a copolymer (A-7) of purified p-hydroxystyrene and styrene.

[Synthesis Example 8] Synthesis of Alkali-Soluble Polyimide (A-8)

Under a dry nitrogen stream, 11.9 g (0.033 mol) of BAHF, 15.0 g (0.015 mol) of aliphatic diamine RT-1000 (manufactured by HUNTSMAN Corporation), and 0.62 g (0.0025 mol) of 1,3-bis(3-aminopropyl)tetramethyldisiloxane were dissolved in 100 g of NMP. To this, 0.62 g (0.0025 mol) of 1,3-bis(3-aminopropyl)tetramethyldisiloxane, 2.33 g (0.0075 mol) of 4,4'-oxydiphthalic anhydride, and 0.82 g (0.005 mol) of 5-norbornene-2,3-dicarboxylic acid, together with 25 g of NMP, were added and reacted at 85° C. for 3 hours. After completion of the reaction, the reaction solution was cooled to room temperature, to which 13.20 g (0.25 mol) of acetic acid, together with 25 g of NMP, was added, and stirred at room temperature for one hour. After completion of the stirring, the solution was poured into 1.5 L of water to afford a white precipitate. This precipitate was collected by filtration, washed with water 3 times, dried in a forced-air dryer at 50° C. for 3 days to afford a powder of an alkali-soluble polyimide resin (A-8).

[Synthesis Example 9] Synthesis of Quinone Diazide Compound

Under a dry nitrogen stream, 15.31 g (0.05 mol) of TrisP-HAP (which is a trade name, manufactured by Honshu Chemical Industry Co., Ltd.) and 26.86 g (0.10 mol) of 5-naphthoquinonediazidesulfonyl chloride (NAC-5, manufactured by Toyo Gosei Co. Ltd.) were dissolved in 450 g of 1,4-dioxane, followed by returning to room temperature. To this, a liquid mixture of 50 g of 1,4-dioxane and 15.18 g of triethylamine was dropwisely added in such a manner that the temperature in the system was not 35° C. or higher. After the dropwise addition, the solution was stirred at 30° C. for 2 hours. The triethylamine salt was removed by filtration, and the filtrate was introduced into 3 L of water to afford a precipitate. This precipitate was collected by filtration and then washed with 1 L of 1 wt % hydrochloric acid. Subsequently, the washed product was further washed with 2 L of water two times. This precipitate was dried in a vacuum dryer to afford a quinonediazide compound (B-1) represented by the formula (4) in which an average of two of the Qs in one molecule were 5-naphthoquinonediazidesulfonic-acid-esterified.

[Chem. 6]

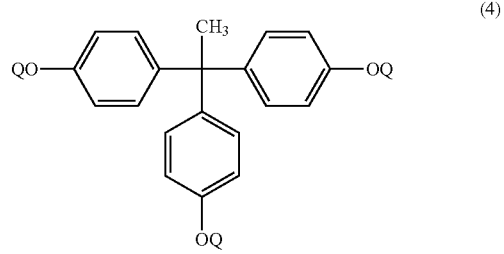

(4)

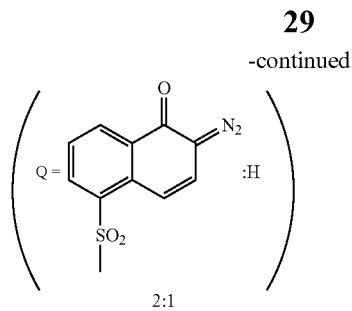

The compound represented by the general formula (1) used in Examples is shown below

[Chem. 7]

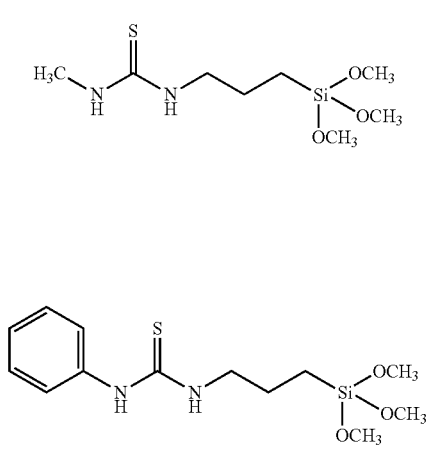

C-1

C-2

C-3

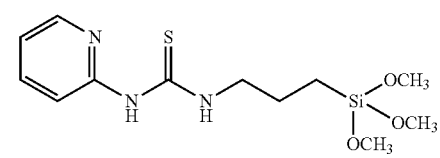

C-4

The structure of the crosslinking agent HMOM-TPHAP (which is a trade name, manufactured by Honshu Chemical Industry Co., Ltd.) (hereinafter referred to as HMOM) used in Examples is shown below

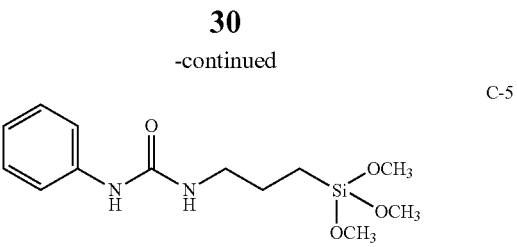

C-5

[Chem. 8]

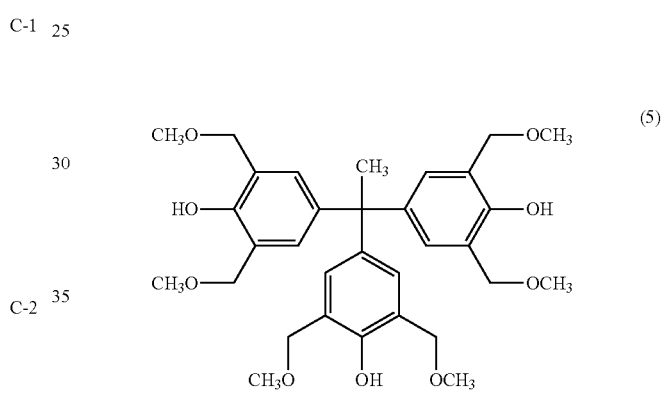

(5)

The adhesion-improving agent KBE-585 (which is a trade name, manufactured by Shin-Etsu Chemical Co., Ltd.) used in Comparative Examples was 3-ureidopropyltrialkoxysilane.

Examples 1 to 16, Comparative Examples 1 to 8

The raw materials were mixed and dissolved based on the compositions shown in Table 1 to produce photosensitive resin compositions (varnish). As a solvent, 15 g of γ-butyrolactone (hereinafter referred to as GBL) was used. The varnish produced was used to be evaluated for adhesion characteristics, sensitivity, and chemical resistance by the aforementioned method. The evaluation results are shown in Table 1.

TABLE 1

| | Alkali-Soluble Resin | Quinone Diazide Compound | Compound represented by General Formula (1) | Cross-linking Agent | Solvent | Adhesion (Number of Pieces Peeled off) Before PCT treatment | Adhesion (Number of Pieces Peeled off) 400 hours after PCT treatment | Sensitivity mJ/cm² | Chemical Resistance |
|---|---|---|---|---|---|---|---|---|---|
| Example 1 | A-1 5 g | B-1 0.7 g | C-5 0.07 g | HMOM 1.0 g | GBL | 0 | 0 | B | B |
| Example 2 | A-1 5 g | B-1 0.7 g | C-1 0.07 g | HMOM 1.0 g | GBL | 0 | 0 | A | B |
| Example 3 | A-1 5 g | B-1 0.7 g | C-1 0.07 g | HMOM 1.2 g | GBL | 0 | 0 | A | A |
| Example 4 | A-1 5 g | B-1 0.7 g | C-1 0.07 g | HMOM 1.5 g | GBL | 0 | 0 | A | A |
| Example 5 | A-1 5 g | B-1 0.7 g | C-1 0.1 g | HMOM 1.0 g | GBL | 0 | 0 | A | B |
| Example 6 | A-1 5 g | B-1 0.7 g | C-1 0.15 g | HMOM 1.0 g | GBL | 0 | 0 | A | B |
| Example 7 | A-1 5 g | B-1 0.7 g | C-2 0.07 g | HMOM 1.0 g | GBL | 0 | 0 | A | B |
| Example 8 | A-1 5 g | B-1 0.7 g | C-3 0.07 g | HMOM 1.0 g | GBL | 0 | 0 | A | B |
| Example 9 | A-1 5 g | B-1 0.7 g | C-4 0.07 g | HMOM 1.0 g | GBL | 0 | 0 | A | B |
| Example 10 | A-2 5 g | B-1 0.7 g | C-1 0.07 g | HMOM 1.0 g | GBL | 0 | 2 | A | B |
| Example 11 | A-3 5 g | B-1 0.7 g | C-1 0.07 g | HMOM 1.0 g | GBL | 0 | 0 | A | B |
| Example 12 | A-4 5 g | B-1 0.7 g | C-1 0.07 g | HMOM 1.0 g | GBL | 0 | 3 | A | B |
| Example 13 | A-5 5 g | B-1 0.7 g | C-5 0.07 g | HMOM 1.0 g | GBL | 0 | 15 | B | B |
| Example 14 | A-1 2.5 g A-6 2.5 g | B-1 0.7 g | C-1 0.07 g | HMOM 1.0 g | GBL | 0 | 0 | A | A |
| Example 15 | A-1 2.5 g A-7 2.5 g | B-1 0.7 g | C-2 0.07 g | HMOM 1.0 g | GBL | 0 | 0 | A | A |
| Example 16 | A-1 5 g | B-1 0.7 g | C-5 0.07 g | HMOM 1.5 g | GBL | 7 | 15 | B | A |
| Example 17 | A-8 5 g | B-1 0.7 g | C-1 0.07 g | HMOM 1.0 g | GBL | 0 | 0 | A | A |
| Comparative Example 1 | A-1 5 g | B-1 0.7 g | none | HMOM 1.0 g | GBL | 0 | 100 | A | B |
| Comparative Example 2 | A-2 5 g | B-1 0.7 g | none | HMOM 1.0 g | GBL | 0 | 100 | A | B |
| Comparative Example 3 | A-3 5 g | B-1 0.7 g | none | HMOM 1.0 g | GBL | 0 | 60 | A | B |
| Comparative Example 4 | A-4 5 g | B-1 0.7 g | none | HMOM 1.0 g | GBL | 100 | — | A | B |
| Comparative Example 5 | A-4 5 g | B-1 0.7 g | KBE-585 0.07 g | HMOM 1.0 g | GBL | 0 | 100 | C | B |
| Comparative Example 6 | A-1 5 g | B-1 0.7 g | none | HMOM 1.5 g | GBL | 100 | 100 | A | A |
| Comparative Example 7 | A-6 5 g | B-1 0.7 g | C-1 0.07 g | — | GBL | 0 | 100 | A | C |
| Comparative Example 8 | A-6 5 g | B-1 0.7 g | C-1 0.07 g | HMOM 1.0 g | GBL | 0 | 100 | A | B |

The content of the crosslinking agent was 20 parts by weight in Examples 1 to 2 and 5 to 15 and Comparative Examples 1 to 5 and 8; 24 parts by weight in Example 3; 30 parts by weight in Examples 4 and 16 and Comparative Example 6; and 40 parts by weight in Examples 14 and 15; relative to 100 parts by weight of one or more kinds of alkali-soluble resins selected from a polyimide, a polybenzoxazole, a polyimide precursor, a polybenzoxazole precursor, and a copolymer of two or more kinds of polymers selected therefrom.

REFERENCE SIGNS LIST

1; Silicon wafer
2; Al pad
3: Passivation film
4: Insulating film
5: Metal film
6: Metal wiring
7: Insulating film
8: Barrier metal
9: Scribe line
10: Solder bump

The invention claimed is:

1. A photosensitive resin composition comprising:
one or more kinds of alkali-soluble resins selected from a polyimide, a polybenzoxazole, a polyimide precursor, a polybenzoxazole precursor, and a copolymer of two or more kinds of polymers selected therefrom; and
a photosensitizer;
wherein the photosensitive resin composition further comprises a compound represented by the following general formula (1):

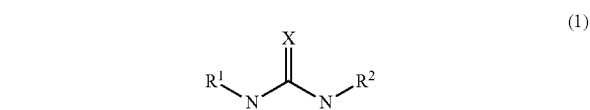

wherein, in the general formula (1), $R^1$ and $R^2$ each independently represent a $C_1$-$C_{20}$ monovalent organic group; and X represents a sulfur atom.

2. The photosensitive resin composition according to claim 1, comprising 0.1 to 5.0 parts by weight of the compound represented by the general formula (1) relative to 100 parts by weight of the alkali-soluble resin.

3. The photosensitive resin composition according to claim 1, wherein at least one of $R^1$ and $R^2$ in the compound represented by the general formula (1) is an organic group containing an alkoxysilyl group.

4. The photosensitive resin composition according to claim 1, wherein the alkali-soluble resin comprises a structure represented by the following general formula (2) or (3):

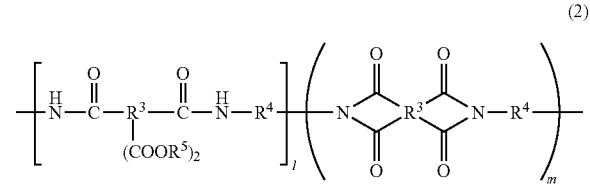

-continued

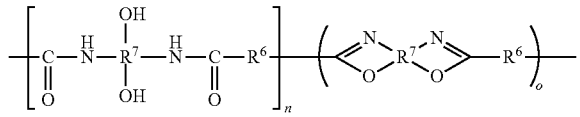

(3)

wherein, in the general formulae (2) and (3), $R^3$ and $R^7$ each independently represent a $C_6$-$C_{40}$ tetravalent organic group;

$R^4$ and $R^6$ each independently represent a $C_2$-$C_{40}$ bivalent organic group;

$R^5$ represents hydrogen or a $C_1$-$C_{20}$ monovalent organic group;

l, m, n, and o each independently represent an integer of 0 to 10,000;

l+m>1; and n+o>1.

5. The photosensitive resin composition according to claim 4, wherein the alkali-soluble resin including the structure represented by the general formula (2) contains a phenolic hydroxyl group.

6. The photosensitive resin composition according to claim 4, wherein the alkali-soluble resin represented by the general formula (2) contains 30 mol % or more organic groups containing a fluorine atom relative to the total amount of the organic groups of both $R^3$ and $R^4$ as 100 mol %.

7. The photosensitive resin composition according to claim 4, wherein the alkali-soluble resin represented by the general formula (3) contains 30 mol % or more organic groups containing a fluorine atom relative to the total amount of the organic groups of both $R^6$ and $R^7$ as 100 mol %.

8. The photosensitive resin composition according to claim 1, wherein the photosensitive resin composition further comprises a crosslinking agent.

9. The photosensitive resin composition according to claim 8, wherein the crosslinking agent is a compound containing at least 4 alkoxymethyl groups or methylol groups, and the content of the crosslinking agent is 24 to 150 parts by mass relative to 100 parts by mass of the alkali-soluble resin.

10. A method for producing a cured resin film, comprising the steps of:
coating a substrate with the photosensitive resin composition according to claim 1 and drying the composition to obtain a resin film;
exposing the resin film obtained from the previous step;
developing the exposed resin film using an alkali aqueous solution to form a pattern out of the resin film; and
heating the developed resin film.

11. The method for producing a cured resin film according to claim 10, wherein the substrate is a substrate on which metal wiring is formed.

12. The method for producing a cured resin film according to claim 10, further comprising the step of releasing the dried resin film to obtain a photosensitive uncured sheet.

13. A method for producing a photosensitive uncured sheet, comprising the steps of:
coating a substrate with the photosensitive resin composition according to claim 1 and drying the composition to obtain a resin film; and
releasing the resin film obtained from the previous step.

14. A semiconductor device comprising a semiconductor element, wherein a cured film of the photosensitive resin composition according to claim 1 is formed as an interlayer dielectric film on the semiconductor element, wherein wiring is formed on the cured film.

15. A semiconductor device comprising a substrate constituted of two or more kinds of materials, wherein a cured film of the photosensitive resin composition according to claim 1 is formed as an interlayer dielectric film on the substrate, wherein wiring is formed on the cured film.

* * * * *